United States Patent
Taghavi-Larigani et al.

(10) Patent No.: US 6,999,658 B2
(45) Date of Patent: Feb. 14, 2006

(54) OPTICAL RESONATOR AND LASER APPLICATIONS

(75) Inventors: Shervin Taghavi-Larigani, Pasadena, CA (US); Jakob J. Vanzyl, Pasadena, CA (US); Amnon Yariv, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 21 days.

(21) Appl. No.: 10/610,292

(22) Filed: Jun. 30, 2003

(65) Prior Publication Data

US 2004/0062483 A1 Apr. 1, 2004

Related U.S. Application Data

(60) Provisional application No. 60/458,168, filed on Mar. 27, 2003, provisional application No. 60/428,348, filed on Nov. 22, 2002, provisional application No. 60/424,736, filed on Nov. 8, 2002, provisional application No. 60/406,428, filed on Aug. 28, 2002, provisional application No. 60/402,432, filed on Aug. 9, 2002, provisional application No. 60/398,430, filed on Jul. 24, 2002, provisional application No. 60/398,429, filed on Jul. 24, 2002, provisional application No. 60/398,428, filed on Jul. 24, 2002, and provisional application No. 60/392,517, filed on Jun. 28, 2002.

(51) Int. Cl.
*G02B 6/12* (2006.01)
*H01S 3/08* (2006.01)
*H01S 5/10* (2006.01)

(52) U.S. Cl. .......................... 385/32; 385/14; 385/129; 372/43; 372/93; 372/99

(58) Field of Classification Search ................... 385/14, 385/32, 129–131; 372/43–50, 92–93, 98–99
See application file for complete search history.

(56) References Cited

U.S. PATENT DOCUMENTS

| 5,396,511 A | 3/1995 | Nakatsuka et al. |
| 5,398,256 A | 3/1995 | Hohimer et al. |
| 5,956,355 A | 9/1999 | Swanson et al. |
| 6,393,186 B1 | 5/2002 | Deacon |

FOREIGN PATENT DOCUMENTS

| EP | 01024482 | 1/1989 |
| WO | WO 02/08815 A1 | 1/2002 |

OTHER PUBLICATIONS

Amann, M., et al., "Tunable Laser Diodes," Artech House Publishers, pp. 37–44, and pp. 106–108, Aug. 1998.
Borchert, B., et al., "Vertically integrated Mach–Zehnder interferometer (VMZ) widely tunable laser diode with improved wavelength access", Electronics Letters, vol. 30, No. 24, pp. 2047–2049, Nov. 24, 1994.

(Continued)

*Primary Examiner*—John D. Lee
*Assistant Examiner*—Jerry T. Rahll
(74) *Attorney, Agent, or Firm*—Origin Law; Bradley K. Lortz

(57) ABSTRACT

The invention discloses a semi-ring Fabry-Perot (SRFP) optical resonator structure comprising a medium including an edge forming a reflective facet and a waveguide within the medium, the waveguide having opposing ends formed by the reflective facet. The performance of the SRFP resonator can be further enhanced by including a Mach-Zehnder interferometer in the waveguide on one side of the gain medium. The optical resonator can be employed in a variety of optical devices. Laser structures using at least one SRFP resonator are disclosed where the resonators are disposed on opposite sides of a gain medium. Other laser structures employing one or more resonators on one side of a gain region are also disclosed.

20 Claims, 32 Drawing Sheets

OTHER PUBLICATIONS

Coldren, L. A., et al., "Diode Lasers and Photonics Integrated Circuts", John Wiley & Sons, Inc., pp. 42, 45 and 107, 1995.

Kuznetsov, M., et al., "Widely Tunable (45 nm, 5.6 THz) Multi–Quantum–Well Three–Branch Y3–Lasers for WDM Networks," IEEE Photonics Technology Letters, vol. 5, No. 8, pp. 879–882, Aug. 1993.

Liu, Bin et al., "Wide Tunable Double Ring Resonator Coupled Lasers", IEEE Photonics Technology Letters, vol. 14, No. 5, pp. 600–602, May 2002.

Yariv, A., "Universal relations for coupling of optical power between microresonators and dielectric waveguides," Electronics Letters, vol. 36, No. 4, p. 321, Feb. 17, 2000.

OPTICAL RESONATOR AND LASER APPLICATIONS

CROSS-REFERENCE TO RELATED APPLICATIONS

This application claims the benefit under 35 U.S.C. §119(e) of the following co-pending U.S. Provisional Patent Applications, which are all incorporated by reference herein:

U.S. Provisional Application Ser. No. 60/392,517, filed Jun. 28, 2002, by Shervin Taghavi, entitled "TUNABLE SEMICONDUCTOR LASER BASED ON THE COMBINATION OF A MACH-ZEHNDER INTERFEROMETER WITH A FABRY-PEROT OR A RING RESONATOR CAVITY, USING ONLY ONE COUPLING REGION AND EXHIBITING A HIGH MODE SUPPRESSION RATIO" with attorney docket number CIT-3717-P;

U.S. Provisional Application Ser. No. 60/398,428, filed Jul. 24, 2002, by Shervin Taghavi, entitled "NOVEL WIDE TUNABLE SEMICONDUCTOR LASERS BASED ON THE COMBINATION OF A MACH-ZEHNDER INSIDE A RING RESONATOR CAVITY, USING ONLY ONE COUPLING REGION AND EXHIBITING HIGH MODE SUPRESSION RATIO" with attorney docket number CIT-3733-P;

U.S. Provisional Application Ser. No. 60/398,429, filed Jul. 24, 2002, by Shervin Taghavi, entitled "NOVEL WIDE TUNABLE SEMICONDUCTOR LASERS BASED ON THE COMBINATION OF A MACH-ZEHNDER INSIDE A FABRY-PEROT CAVITY RESONATOR, USING ONLY ONE COUPLING REGION AND EXHIBITING HIGH MODE SUPRESSION RATIO" with attorney docket number CIT-3731-P;

U.S. Provisional Application Ser. No. 60/398,430, filed Jul. 24, 2002, by Shervin Taghavi, entitled "NOVEL WIDE TUNABLE SEMICONDUCTOR LASERS BASED ON THE COMBINATION OF A RING RESONATOR CAVITY INSIDE A FABRY-PEROT CAVITY" with attorney docket number CIT-3732-P;

U.S. Provisional Application Ser. No. 60/402,432, filed Aug. 9, 2002, by Shervin Taghavi, entitled "NOVEL WIDE TUNABLE SEMICONDUCTOR LASERS BASED ON THE COMBINATION OF A MACH-ZEHNDER INTERFEROMETER INSIDE A FABRY-PEROT" with attorney docket number CIT-3731-P2;

U.S. Provisional Application Ser. No. 60/406,428, filed Aug. 28, 2002, by Shervin Taghavi et al., entitled "NOVEL TUNABLE SEMICONDUCTOR LASERS BASED ON THE COMBINATION OF TWO RESONATORS" with attorney docket number CIT-3753-P;

U.S. Provisional Application Ser. No. 60/424,736, filed Nov. 8, 2002, by Shervin Taghavi, entitled "DOUBLE SEMI-RING FABRY-PEROT-COUPLED LASER DSRFP-CL" with attorney docket number CIT-3801-P;

U.S. Provisional Application Ser. No. 60/428,348, filed Nov. 22, 2002, by Shervin Taghavi et al., entitled "NOVEL TUNABLE SEMICONDUCTOR LASERS BASED ON THE COMBINATION OF TWO RESONATORS" with attorney docket number CIT-3753-P2; and U.S. Provisional Application Ser. No. 60/458,168, filed Mar. 27, 2003, by Shervin Taghavi, entitled "NOVEL TUNABLE SEMICONDUCTORS USING THE VERNIER TECHNIQUE FOR TUNING AND HAVING THE TWO RESONATORS AT THE SAME SIDE OF THE GAIN MEDIUM" with attorney docket number CIT-3769-P.

STATEMENT OF GOVERNMENT RIGHTS

The invention described herein was made in the performance of work under a NASA contract, and is subject to the provisions of Public Law 96-517 (35 U.S.C. 202) in which the Contractor has elected to retain title.

BACKGROUND OF THE INVENTION

1. Field of the Invention

The present invention relates to optical devices and methods for producing and operating them. Particularly, the present invention relates to optical resonators and their applications in tunable semiconductor lasers.

2. Description of the Related Art

In recent years, the development of optical devices for various applications such as tunable semiconductor lasers has received much attention. For example, fiber optic communication systems employ widely tunable semiconductor lasers in wavelength division multiplexing applications. Accordingly, various forms of tunable semiconductor lasers and related devices have been developed.

Many of the developed tunable semiconductor lasers require relatively complex manufacturing processes and may employ grating structures and/or moving components. In addition, multiple optical couplers in many tunable semiconductor lasers can reduce the overall performance, such as indicated by the mode suppression ration (MSR).

Two fundamental types of optical resonators are the Fabry-Perot cavity and the ring resonator. The Fabry-Perot cavity comprise two parallel reflective planes separated by a distance. Resonance (constructive interference of the reflected light) occurs for specific wavelengths of light reflected between the reflective planes when the distance between the planes is an even multiple of the light wavelength. Thus, the pattern for resonance is periodic across wavelengths. Reflective gratings have also been used in the place of the reflective planes achieve similar results. In addition, ring resonators establish resonance in a similar manner, but the critical distance is defined by the circumference of circular waveguide rather than the separation between two reflective planes. Both fundamental types of optical resonators have been used in a vast number of various optical devices such as tunable lasers. However, both types present different manufacturing and design difficulties in their use. For example, conventional Fabry-Perot resonators are typically constrained (or are constrained by) other device parameters, e.g., the gain medium length must coincide with the length of the Fabry-Perot cavity. The use of ring resonators is often complicated by the need for multiple coupling regions.

There is a need for optical resonators which are simple to manufacture and can be used in the production of optical devices such as tunable semiconductor lasers. Further, there is a need for optical resonators which can be implemented with fewer manufacturing and design constraints. There is also a need for tunable semiconductor lasers which operate without grating structures or moving components. As detailed hereafter, the present invention possesses these and other advantages.

SUMMARY OF THE INVENTION

The present invention discloses a novel optical resonator that can be employed in new classes of widely tunable semiconductor lasers and other optical devices. Embodiments of the invention have the advantage of requiring only simple planar fabrication technology. Thus, embodiments of the invention require no grating structure or moving parts. Using a complex field approach, it can be demonstrated that relatively wide tunability, high optical power and a large mode suppression ratio (MSR) can be achieved through a careful design employing this simple architecture. The MSR exhibited by embodiments of the invention (even in the case of low, e.g. approximately 3 dB, coupling between the gain chip and the tunable mirror) is still higher than that obtained with standard designs of tunable lasers based on interferometer techniques. Such standard designs exhibit typical MSRs around 30 dB to 40 dB.

The novel optical resonator of the present invention, hereafter referred to as a semi-ring Fabry-Perot (SRFP) resonator comprises a medium including an edge forming a reflective facet and a waveguide within the medium, the waveguide having opposing ends formed by the reflective facet. The performance of the optical resonator can be further enhanced by including a Mach-Zehnder interferometer in the waveguide. The SRFP exhibits its own reflection spectra having a substantially uniform peak transmission at all resonant peaks. The free spectral range of a SRFP is related to its optical length. Accordingly, tuning can be achieved by shifting the peaks by an adjustment of the index of refraction in at least a portion of the SRFP waveguide through current injection.

The SRFP can be employed in a variety of optical devices, such as a semiconductor laser where the resonator is coupled through a coupling region to a gain medium within a Fabry-Perot cavity. A typical laser embodiment of the invention comprises a gain chip including at least one tunable filter element including the novel resonator. There are different acceptable techniques for coupling the gain medium to the tunable feedback element. However, the nature of the coupling is not important for an analytical study of the device.

Some advantages of the SRFP resonator over a conventional ring resonator are that the SRFP resonator supports standing waves and a larger waveguide bending curvature can be used, reducing potential bending losses. Also, the SRFP resonator uses only one coupling region in order to couple back to the gain medium. In addition, one advantage of the SRFP over a conventional Fabry-Perot cavity resonator is the use of only one plane mirror for both reflecting facets. This eases the fabrication of the resonator; the length of the SRFP resonator can greatly differ from that of the chip and the SRFP resonator can be tuned for optimum frequency selection. This yields the further advantage that the FSR of the SRFP resonator is not strongly dictated by fabrication requirements, as it is in the case of conventional Fabry-Perot resonators.

In one exemplary embodiment, the tunable filter element within the gain chip can be constructed by the combination of a Mach-Zehnder interferometer (MZI) within the SRFP inside a Fabry-Perot cavity. The Fabry-Perot cavity includes a waveguide comprising two opposing ends which conclude at a common high reflection facet, forming the SRFP. A coupling region interrupts the waveguide and couples it to the a gain medium within the device. The MZI, having a large free spectral range, is included in the waveguide on one side of the coupling region and selects a particular wavelength region within the gain bandwidth. However, this interferometer does not provide sufficient discrimination between neighboring cavity modes. See e.g., Amann, Markus-Christian et al., "Tunable Laser Diodes", Artech House Publishers, 1998; Kuznetsov, M. et al., "Widely tunable (45 nm, 5.6 THz) multi-quantum well three-branch Y3-lasers for WDM networks", IEEE Photonics Technology Letters, Vol. 5, 1993, pp. 879–882; and Borchert, B. et al., "Vertically integrated Mach-Zehnder interferometer (VMZ) widely tunable laser diode with improved wavelength access", Electronics Letters, Vol. 30, 1994, pp. 2047–2049. Therefore, the SRFP with a small free spectral range selects a particular cavity mode within the wavelength region selected by the MZI. The frequency tunability is obtained by changing the difference of optical length between the two arms of the MZI; the SRFP defines the finesse of the reflector.

In addition, in further embodiments of the invention detailed hereafter multiple resonators, and particularly SRFP resonators, are used to produce tunable lasers. Further embodiments of the invention include a novel class of tunable semiconductor lasers using the Vernier technique where the two resonators are localized in the same side of the gain medium. These devices can exhibit both high tunability through application of the Vernier technique and high power because the two resonators are localized in the same side of the gain medium.

In still further embodiments of the invention, other novel laser structures are also disclosed which do not employ the semi-ring Fabry-Perot resonator.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

1. Semi-Ring Fabry-Perot Resonator

Figure 1A:
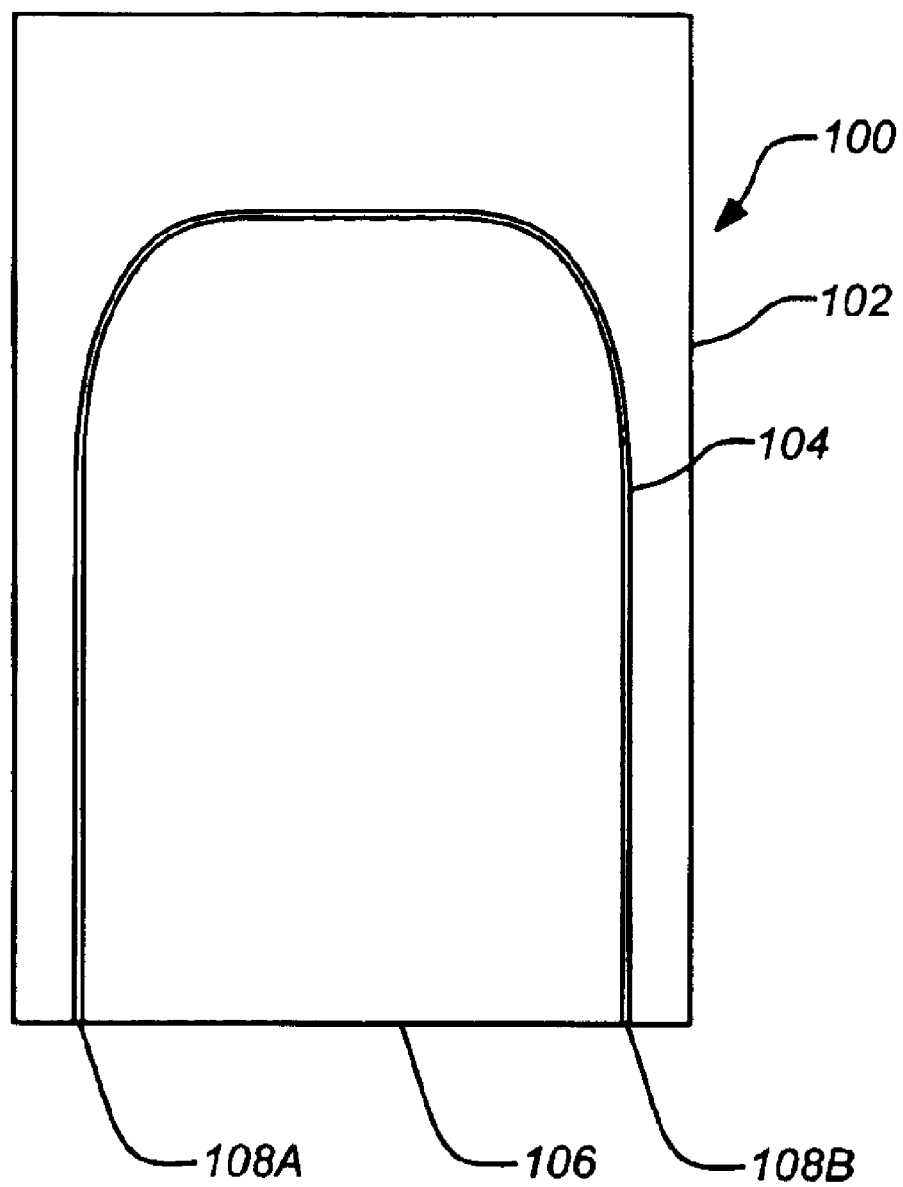
FIG. 1A illustrates a top view of an optical resonator of the invention.

FIG. 1A illustrates a novel optical resonator of the present invention. The resonator 100, a semi-ring Fabry-Perot (SRFP) resonator 100, comprises a medium 102 (such as a semiconductor material) including an edge forming a reflective facet 106 and a waveguide 104 within the medium, the waveguide having opposing ends 108A, 108B formed by the reflective facet 106. The resonator 100 behaves similar to a Fabry-Perot resonator with some additional advantageous properties. For example, manufacturing of the resonator 100 is simplified because only a single facet 106 is cut to produce the functional resonator cavity. In addition, due to this simplicity, the range of applications for a resonator 100 based on only a single facet 106 is also broader than for resonators requiring multiple facets; only one free facet is required to tune the resonator 100 in isolation from other elements of a given optical device. This foundational element can be used in a variety of optical devices, and is particularly useful in tunable laser applications. The resonator also has the advantage of a planar fabrication and not of requiring any grating structure or moving parts.

The resonator can be employed as a tunable element by constructing the waveguide 104 (or a portion thereof) such that the optical length is varied by controlled current injection as is known in the art. The current injection changes the index of refraction and therefore the optical length as the device is operated.

Figure 1B:
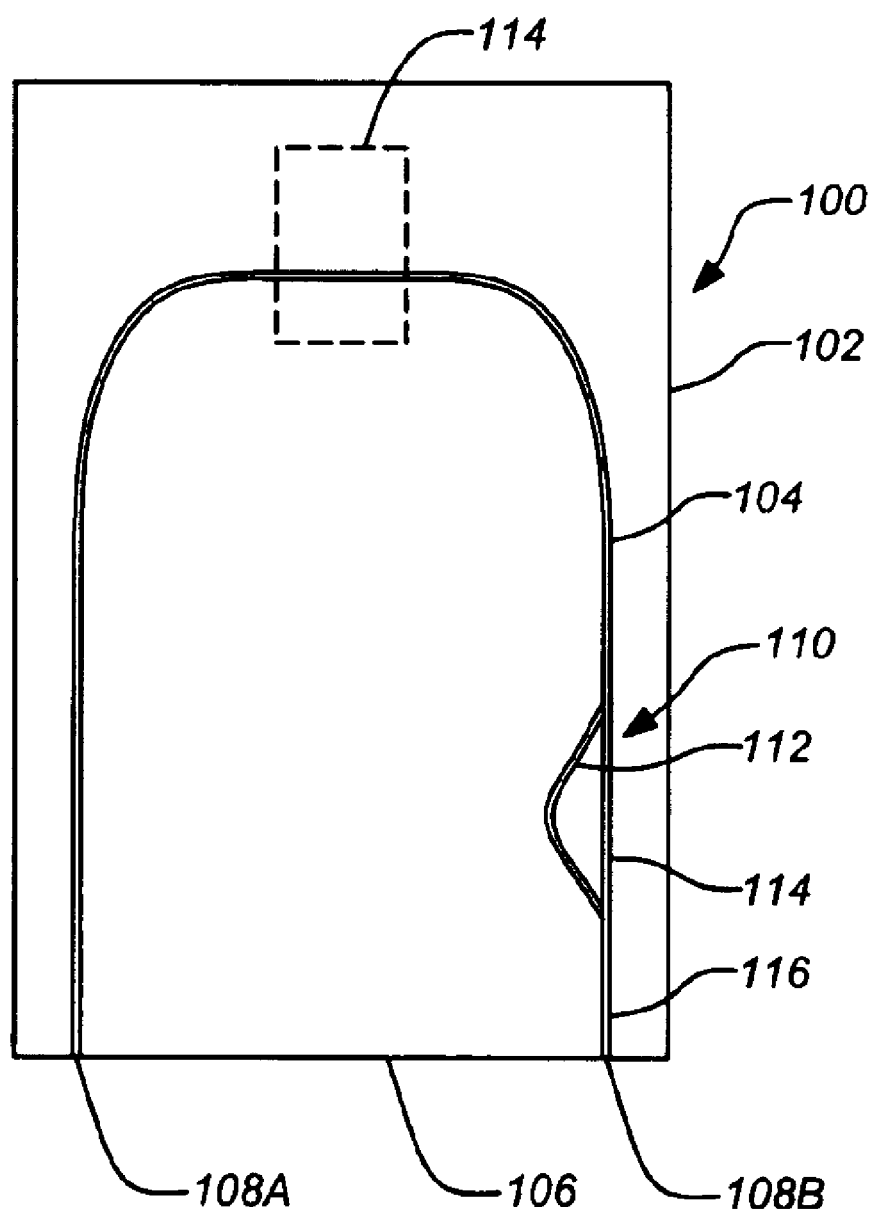
FIG. 1B illustrates a top view of an optical resonator of the invention including a Mach-Zehnder interferometer.

FIG. 1B illustrates the optical resonator 100 with the addition a Mach-Zehnder interferometer (MZI) 110. The addition of the MZI 110 can be used to further enhance the performance and usefulness of the optical resonator 100. The MZI 110 includes a an upper arm 112 and a lower arm 114 that are used to establish a path length differential for light entering the MZI 110. The remaining waveguide 116 (which can be considered a continuation of the waveguide 104) is used to couple the light to the reflective facet 106 at it's end 108B. Also illustrated is a coupling region 114 which can be used to couple feedback from the resonator 100 to other elements in an optical device. It should be noted that the MZI 110 can be positioned on either side of the coupling region 114 in the resonator 100.

To describe intuitively the tunability mechanism one may look at the performance of the unbalanced MZI 110 and the SRFP resonator 100 individually and then in combination. For an ordinary Fabry-Perot cavity in a laser device, lasing is a function of the cavity optical length and typically only occurs near the top of the gain profile of the gain medium. Because adjustment of the cavity optical length is limited, there is no simple technique for tuning over a wide range. In addition, the cavity typically has a relatively broad gain profile, making it possible to have lasing at more than one frequency. In order to select a single frequency for operation, it is necessary to introduce a frequency selective mirror device.

Figure 1C:
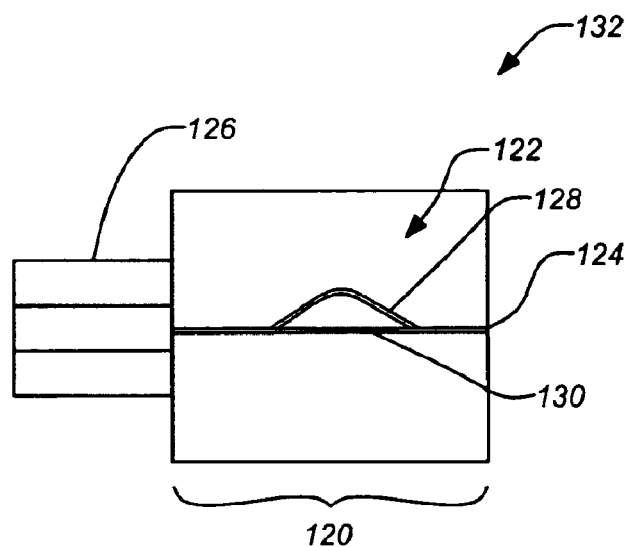
FIG. 1C illustrates a frequency selective mirror device comprising a MZI and a mirror.

FIG. 1C qualitatively illustrates a frequency selective mirror device 120 comprising a MZI 122 and mirror 124, such as a 100% mirrored facet. The MZI 122 alone produces a periodic frequency selectivity to the gain chip 126. Frequency tunability is obtained by changing the difference in optical length between the two arms 128, 130 of the MZI 122, which shifts the mode filtering spectrum of the MZI 122, and consequently changes the lasing mode of the laser 132. The change of the optical length can be induced altering the index of refraction of one or both of the waveguide arms 128, 130 through current injection.

Alternately (or in conjunction with tuning by current injection) tuning may be achieved by changing only the phase of the coupling coefficient. Thus, the resonant frequencies of the device to tune the device. So in order to tune the device, it is not required to change the optical length of the resonator. Tuning of the device can also be obtained by techniques which change the phase of the coupling coefficient.

Figure 1D:
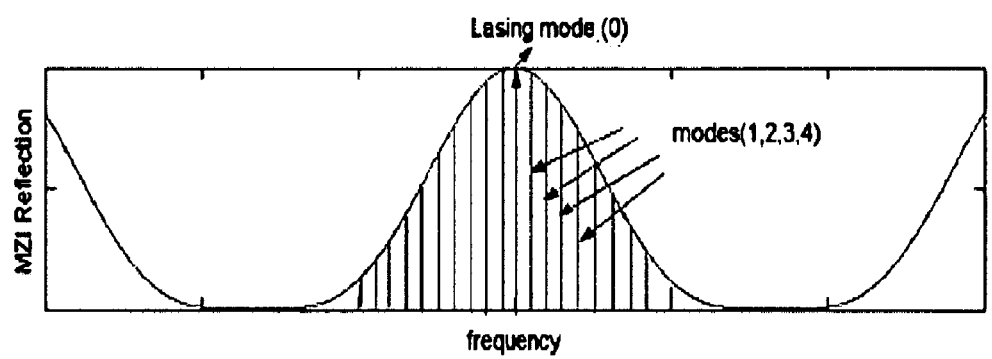
FIG. 1D qualitatively illustrates the reflection output of the frequency selective mirror device using the MZI with respect to frequency.

FIG. 1D qualitatively illustrates the reflection output of the frequency selective mirror device 120 using the MZI 122 with respect to frequency. The cavity modes of the laser 132 are also illustrated. However, the MZI 122 has very low finesse. For a given device length, larger free spectral range (FSR) results in a larger tuning range, but at the expense of the selectivity between the main and the side modes. It should noted that devices similar to the one shown in FIG. 1C do not have high MSR due to the low finesse of the MZI (e.g., as in a known Y-branch laser). The MZI 122 used alone therefore does not often provide adequate selectivity. To significantly improve performance, an increase in the MSR while maintaining the wide tuning range is necessary. To obtain this, requires a more selective filtering method. The combination of the SRFP resonator 100 with an MZI 110 as shown in FIG. 1B provides the needed selectivity.

Figure 1E:
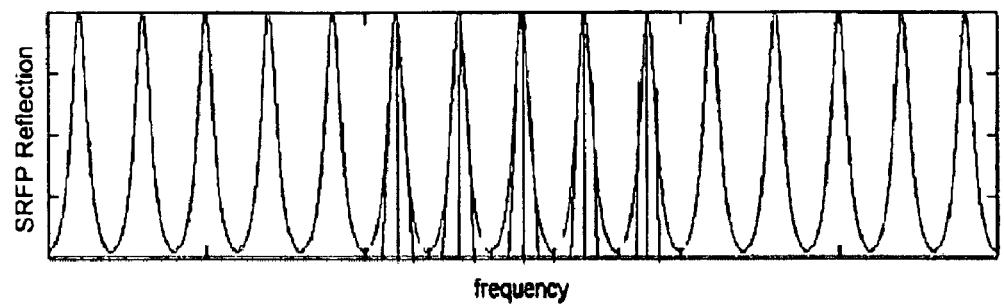
FIG. 1E qualitatively illustrates the reflectance of the SRFP of the present invention.

FIG. 1E illustrates the reflectance of the SRFP resonator 100. The SRFP is analyzed in detail in the next section. The behavior of the SRFP resonator 100 can be simulated by a Fabry-Perot cavity. However, the SRFP resonator 100 has the advantage over a standard Fabry-Perot cavity resonator due to the use of only single facet 106 reflectivity. This eases the fabrication of the resonator 100 because the length of the SRFP resonator 100 is disassociated from that of the chip. The FSR of the SRFP resonator 100 is not constrained by fabrication requirements, as it is in the case of a standard Fabry-Perot cavity resonator.

The SRFP resonator 100 also possesses advantages over a standard ring resonator through its support of standing waves. This allows the SRFP resonator 100 to use only one coupling region 114 in order to couple light from the SRFP resonator 100 back to a gain medium in an optical device.

Figure 1F:
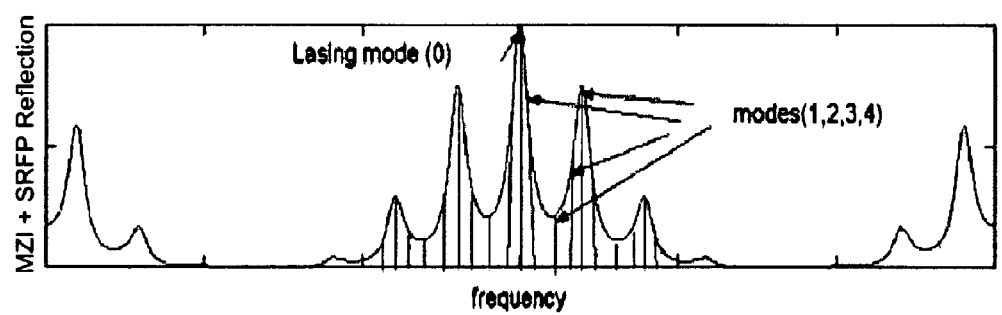
FIG. 1F qualitatively illustrates the combined response of the MZI and the SRFP resonator.

FIG. 1F qualitatively illustrates the combined response of the MZI 110 and the SRFP resonator 100. As shown in FIGS. 1D–1F, the SRFP resonator 100 parameters can be chosen such that the peaks of the SRFP resonator 100 correspond to the peak of the MZI 110 filter, which also corresponds to a cavity mode of the SRFP resonator 100. This main mode, mode 0, will be the lasing mode. Notably, the benefit of the MZI 110 is enhanced by its inclusion within the SRFP resonator 100; conventionally a MZI would be added external to an ordinary Fabry-Perot resonator.

In order to better understand the operation of the SRFP resonator 100 and MZI 110 filter combination, a worst case can be visualized in which each one of the SRFP resonator 100 peaks correspond to a cavity mode (although other cavity modes may also exist at frequencies between the resonator peaks). The SRFP resonator 100 should be designed in a manner to reduce the strength of all the cavity modes between the main mode and the next SRFP resonator peak. The MZI 110 parameters are now selected to ensure that the next SRFP peak becomes the side mode. Referring to FIG. 1E, we note that for the SRFP, if mode 0 is the lasing mode, mode 1 the next cavity mode and mode 4 the cavity mode which is aligned with the next peak of the ring, after adding the MZI filter inside cavity, mode 4 becomes the side mode of the combined device, as shown in FIG. 1F. In the case of the MZI alone, mode 1 is the side mode as shown in FIG. 1D. With this implementation, therefore the MSR is no longer a function of the ratio of mode 0 over mode 1 but it is a function of the ratio of mode 0 over mode 4, making the MSR is a function of the SRFP resonator FSR and MZI gain envelope. The next section presents the theoretical analyses of an exemplary device supporting the foregoing discussion.

2. Exemplary Embodiments of a Laser Using an SRFP Resonator

Figure 2A:
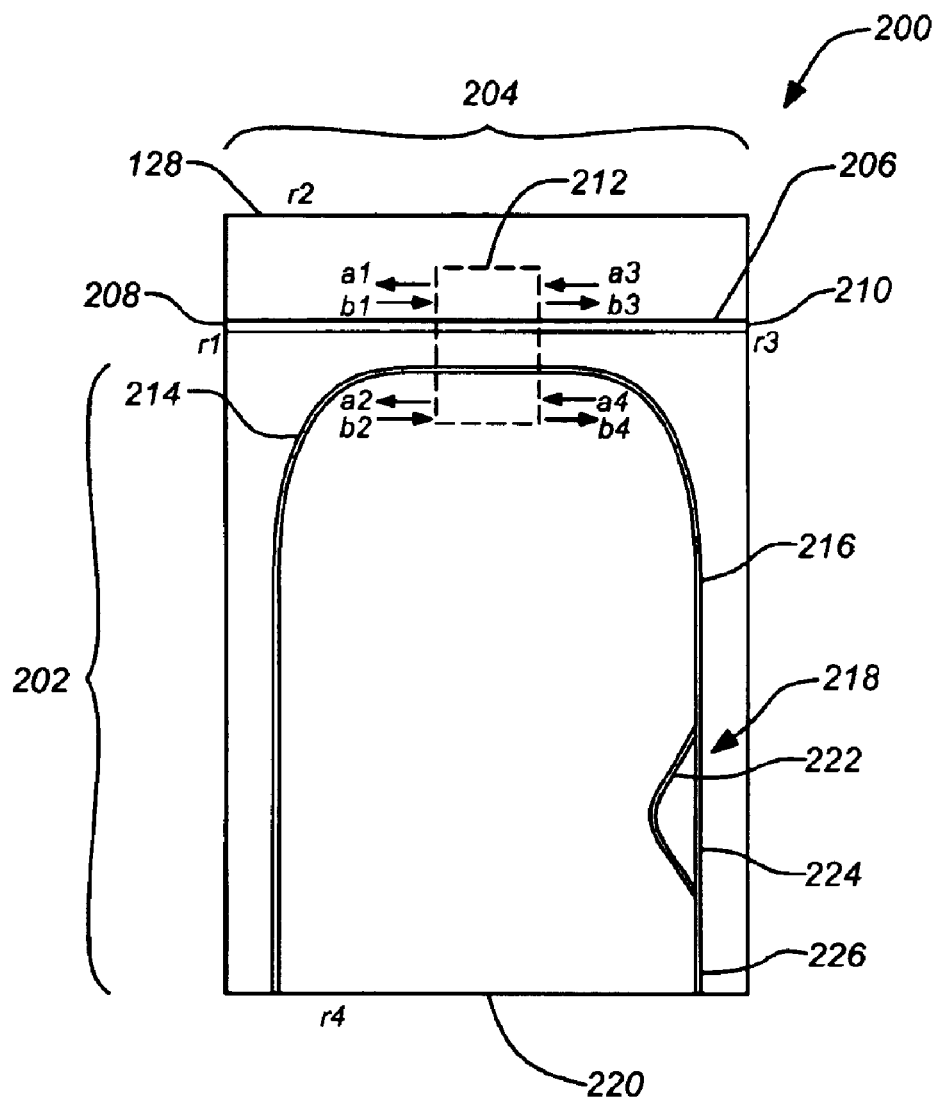
FIG. 2A illustrates a top view of a tunable laser embodiment of the present invention including a tunable element having two waveguides, a MZI and a reflective facet.

FIG. 2A illustrates a top view of a tunable laser embodiment of the present invention including a SFRP tunable element having two waveguides, a MZI and a reflective facet. The tunable laser device 200 comprises a tunable feedback element 202 within a Fabry-Perot cavity 204. The tunable feedback element 202 comprises an optical resonator as described above, a semi-ring Fabry-Perot resonator. The cavity 204 can be defined the gain (active) medium 206 within a waveguide bounded by reflective facets, a rear facet 208 and a front 210 at opposing ends of the gain medium 206. The rear facet 208, bounding one end of the cavity 204, can include an anti-reflection coating. The front facet 210, bounding the opposing end of the cavity 204, comprises the output of the tunable laser device 200.

The coupling region 212 couples the gain medium 206 and the tunable feedback element 202. In the exemplary embodiment shown, the coupling region 212 is disposed within the gain medium 206 and provides an input and output normalized complex field amplitude from each side of the coupling region 212 to the gain medium 206 toward rear facet 208 on one side and toward front facet 210 on the opposite side. Similarly, the tunable feedback element 202 also receives an input and output normalized complex field amplitude from each side of the coupling region 212 to a first waveguide 214 on one side and to a second waveguide 216 on the opposite side.

In this first exemplary embodiment, the tunable feedback element 202 comprises a Mach-Zehnder interferometer (MZI) 218. The first waveguide 214 of the tunable feedback element 202 provides a path from the coupling region 212 to a high reflection rear facet 220 of the passive medium. The second waveguide 216 of the tunable feedback element 202 provides a path from the coupling region to a first end the MZI 218. The MZI 218 includes a an upper arm 222 and a lower arm 224 that are used to establish a path length differential for light entering the MZI 218. The opposite end of the MZI 218 is coupled to a third waveguide 226 that provides a path from the MZI 218 to the high reflection rear facet 220 of the passive medium. It should be noted that the two waveguides of the described embodiment refer to the first waveguide 214 on one side of the coupling region 212 and the combination of the second and third waveguides 214, 226 that are interrupted by the MZI 218 on opposite of the coupling region 212. Alternately, the tunable feedback element 202 can be structured with the MZI 218 positioned on the first waveguide 214 and the second waveguide 214 coupled directly to the rear facet 220.

It should be noted that facets 208, 210 and 220 are generally formed from each entire respective surface of the device 200. This greatly simplifies the manufacturing process. Thus, rear facet 220 of the passive medium can be formed from the edge surface of the device 200 adjacent to both the surfaces of rear facet 208 of the active medium and front facet 210 of the active medium of the cavity 204. Similarly, the front facet 228 of the passive medium can be formed from the entire edge surface opposite the rear facet 220.

The coupling region 212 between the gain medium 206 and the tunable feedback element 202 can be modeled as follows using a similar approach as in A. Yariv, "Universal relations for coupling of optical power between micro resonators and dielectric waveguides", Electronics Letters, vol. 36, page 321, 2000, which is incorporated by reference herein, the gain-tunable element coupling region 212 as shown in FIG. 2A, where $a_i$ and $b_i$ are the input and output, respectively, normalized complex field amplitudes entering and leaving the coupling region 212. Under the condition of lossless coupling, that is, $$|K_i(f)|^2 + |t_i(f)|^2 = 1 \tag{1}$$

The complex field amplitudes satisfies the following set of equations, $$b_1 = 0a_1 + 0a_2 + t_1(f)a_3 + K_1(f)a_4$$

$$b_2 = 0a_1 + 0a_2 - K_1(f)a_3 + t_1(f)^* a_4$$

$$b_3 = t_2(f)a_1 + K_2(f)a_1 + 0a_3 + 0a_4$$

$$b_4 = -K_2(f)^* a_2 + t_2(f)^* a_2 + 0a_3 + 0a_4, \tag{2}$$

where f is the frequency of the field, $t_1(f)$, $t_2(f)$ and $K_1(f)$, $K_2(f)$ are the transmission and coupling coefficients of the complex field region, respectively. The set of equations (2) can be also written in the matrix form, $$\begin{pmatrix} b_1 \\ b_2 \\ b_3 \\ b_4 \end{pmatrix} = \begin{pmatrix} 0 & 0 & t_1(f) & K_1(f) \\ 0 & 0 & -K_1(f)^* & t_1(f)^* \\ t_2(f) & K_2(f) & 0 & 0 \\ -K_2(f)^* & t_2(f)^* & 0 & 0 \end{pmatrix} \begin{pmatrix} a_1 \\ a_2 \\ a_3 \\ a_4 \end{pmatrix} \tag{3}$$

The tunable feedback element 202 shown in FIG. 2A can be analyzed as follows. In the structure of FIG. 2A, $$\frac{a_4}{b_4} = R_4 = A\cos^2\left(\frac{\pi}{c}f(n_u L_u - n_l L_l)\right)(-r_4) \tag{4}$$

where $$A = e^{-\left(2\alpha_a n_a L_a + 2\alpha_b n_b L_b + 2\alpha_c n_c L_c + j\frac{2\pi f}{c}(2n_a L_a + 2n_b L_b + n_u L_u + n_l L_l)\right)} \tag{5}$$

$$a_2 = (-r_4)e^{-(2n_c \alpha_c L_c)}e^{-j\frac{2\pi f}{c}(2n_c L_c)}b_2$$

where $\alpha_a$, $n_a$ and $L_a$ are respectively, the loss per unit length, the refractive index and the length of the waveguide 216 and $\alpha_b$, $n_b$ and $L_b$ are the corresponding quantities for the waveguide 224. $n_u$ and $L_u$ are respectively the refractive index and the length of the upper arm 220 of the MZI 218 and $n_l$, and $L_l$, are the respective corresponding quantities for the lower arm 222 of the MZI 118. $r_2$ is the field reflectivity of the front facet 226 of the passive medium and $r_4$ is that of the rear facet 220 of the passive medium.

Since in the rear facet 208 of the active medium is an anti reflection coating, $a_1=0$. From equations (3), (4) and (5), one can determine, $$\frac{b_3}{a_3} = t_2(f)R_1[t_1(f) + K_1(f)R_{a4a3}] + \qquad(6)$$
$$K_2(f)R_2[-K_1(f) + t_1(f)*R_{a4a3}] \text{ where,}$$

$$R_1 = -r_1, \qquad(7)$$

$$R_{a4a3} = -\frac{R_4(K_2(f)R_1t_1(f) + t_2^*R_2K_1)}{[1 - R_4(t_2(f)*R_2t_1(f)*-K_2(f)R_1K_1(f))]}, \qquad(8)$$

$$R_4 = A\cos^2\left(\frac{\pi}{c}f(n_uL_u - n_lL_l)\right)(-r_4), \qquad(9)$$

$$A = e^{-\left(\frac{2n_a\alpha_aL_a + 2n_b\alpha_bL_b + 2n_c\alpha_cL_c +}{j\frac{2\pi f}{c}(2n_aL_a + 2n_bL_b + 2n_cL_c + n_uL_u + n_lL_l)}\right)}. \qquad(10)$$

In the case of a tunable laser for WDM applications, one can neglect the frequency dependence of the coupling region over the working frequency range to obtain a rough approximation. Accordingly, it follows that, $$K_i = |K_i|e^{j\Phi_{k_i}}, t_i = |t_i|e^{j\Phi_{t_i}} \qquad(11)$$

$f_1$ the "resonant frequency" of the tunable element has to satisfy equation (11), which implies, $$\cos^2\left(\frac{\pi}{c}f_1(n_uL_u - n_lL_l)\right) = 1, \qquad(12)$$

$$e^{-j(D+E+F)} = 1, \qquad(13)$$

where, $$D = -\Phi_{t_1} - \Phi_{t_2}, \qquad(14)$$

$$E = \frac{2\pi f_1}{c}(n_uL_u + n_lL_l) + \frac{2\pi f_1}{c}(2n_aL_a), \qquad(15)$$

$$F = \frac{2\pi f_1}{c}(n_cL_c) + \frac{2\pi f_1}{c}(2n_bL_b) \qquad(16)$$

If $\Delta f$ is defined through the relation, $$f = f_1 + f - f_1 = f_1 + \Delta f, \qquad(17)$$

the following result is obtained, $$\frac{b_3}{a_3} = K_2(-K_2^*)r_2\left[1 + \frac{GH}{1-GH}\right], \text{ where,} \qquad(18)$$

$$G = e^{-\left(2\alpha_aL_a + 2\alpha_bL_b + 2\alpha_cL_c + j\frac{2\Delta f\pi}{c}(2n_aL_a + 2n_bL_b + 2n_cL_c + n_uL_u + n_lL_l)\right)} \qquad(19)$$

$$H = |t_1||t_2|r_4\cos\left(\frac{\pi\Delta f}{c}(n_uL_u - n_lL_l)\right)^2 \qquad(20)$$

3. Other Laser Embodiments

Further embodiments of the invention can be constructed including variants of the tunable element detailed above respecting FIG. 1A. Applying the foregoing analytic framework, similar analysis can be rendered for the following embodiment by those skilled in the art.

Figure 2B:
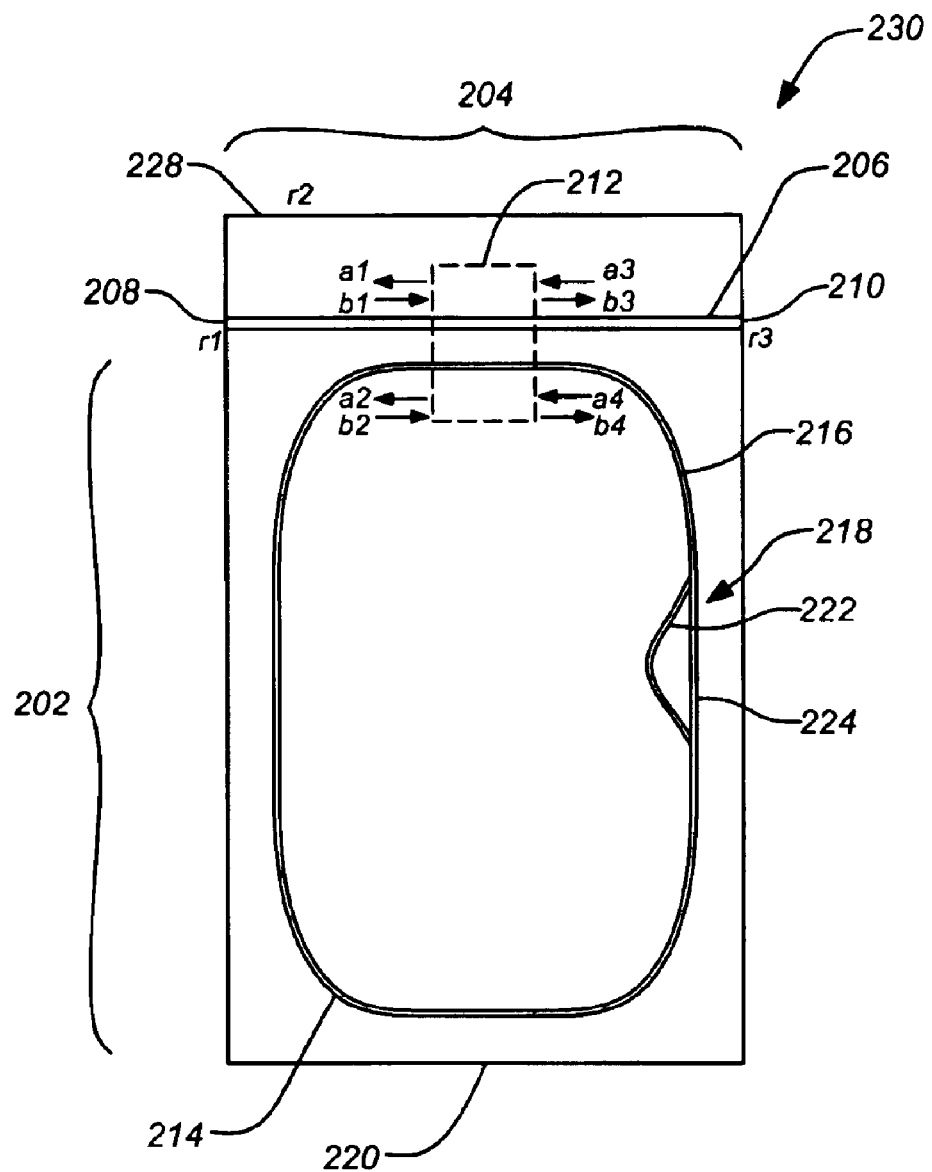
FIG. 2B illustrates a top view of a second tunable laser embodiment of the present invention including a tunable element having a ring resonator and a MZI.

FIG. 2B illustrates a top view of a second tunable laser embodiment of the present invention including a tunable element having a ring resonator and a MZI 218. In this embodiment 230, the tunable feedback element 202 is constructed differently than that of FIG. 2A. The MZI 218 and the ring resonator, comprising waveguides 214 and 216, within the Fabry-Perot cavity 204 are not coupled a rear facet 220 of the passive medium as with the embodiment of FIG. 2A. As such, this novel laser structure does not employ a semi-ring Fabry-Perot resonator. Instead, the waveguide 214 is coupled back into waveguide 216 through the MZI 218 as shown.

Figure 2C:
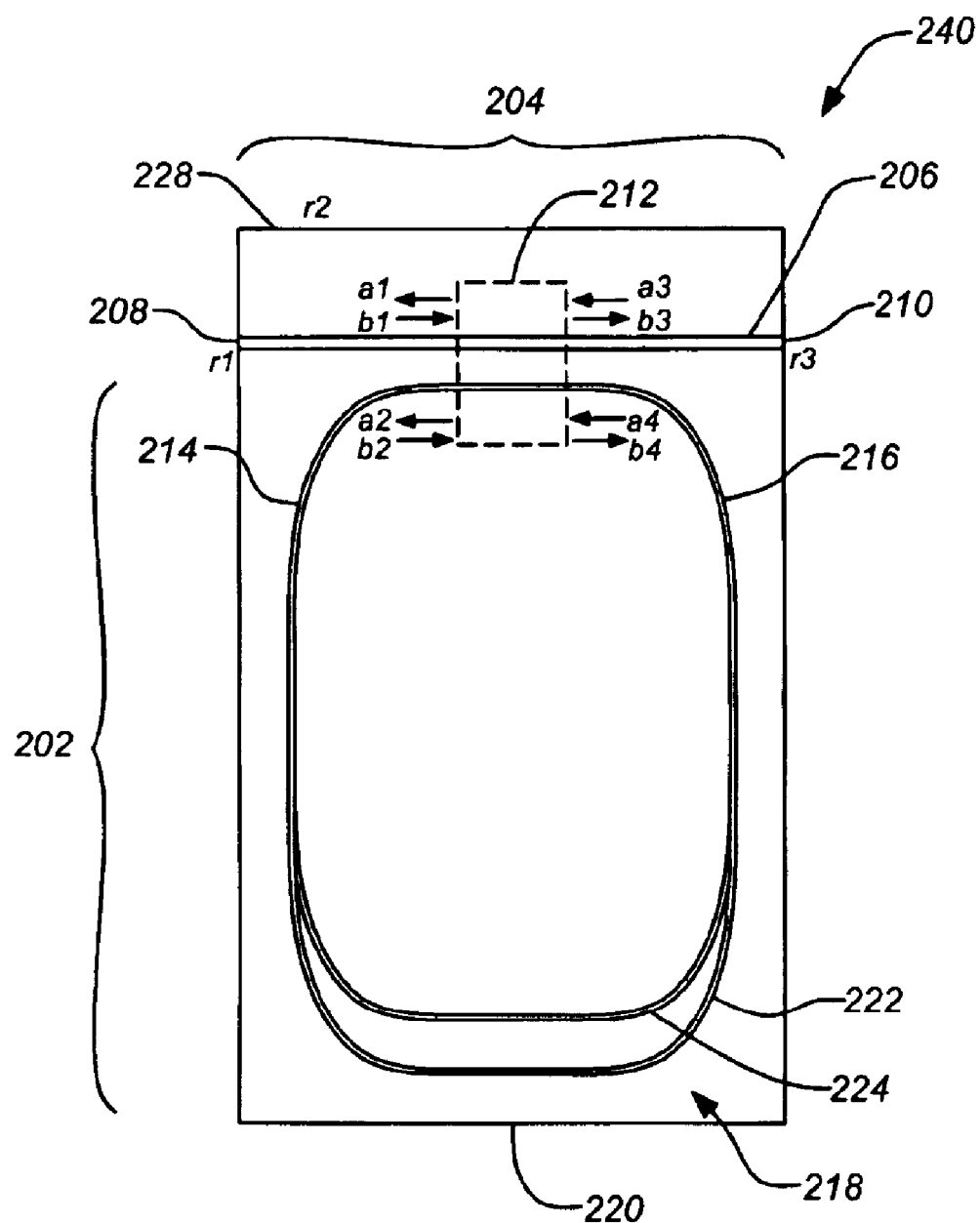
FIG. 2C illustrates a top view of a structural variant of the FIG. 2B embodiment of the present invention including a tunable element having a ring resonator and a MZI.

FIG. 2C illustrates a top view of a structural variant of the FIG. 2B embodiment of the present invention including a tunable element having a ring resonator and a MZI. This embodiment 240 is theoretically identical to that of FIG. 2B. The ring resonator waveguides 214 and 216 are coupled through MZI 218 as shown. However, in this embodiment the MZI 118 is structured with the upper arm 222 of the MZI 218 adjacent and parallel to the rear facet 220 of the passive medium. The lower arm 224 of the MZI 218 disposed adjacent and parallel to the upper arm 222. As with the embodiment of FIG. 2B, this novel laser structure does not employ a semi-ring Fabry-Perot resonator. This embodiment 240 illustrates that the position and structure of the MZI 218 can be varied. The invention is not limited to the specific examples shown.

Figure 2D:
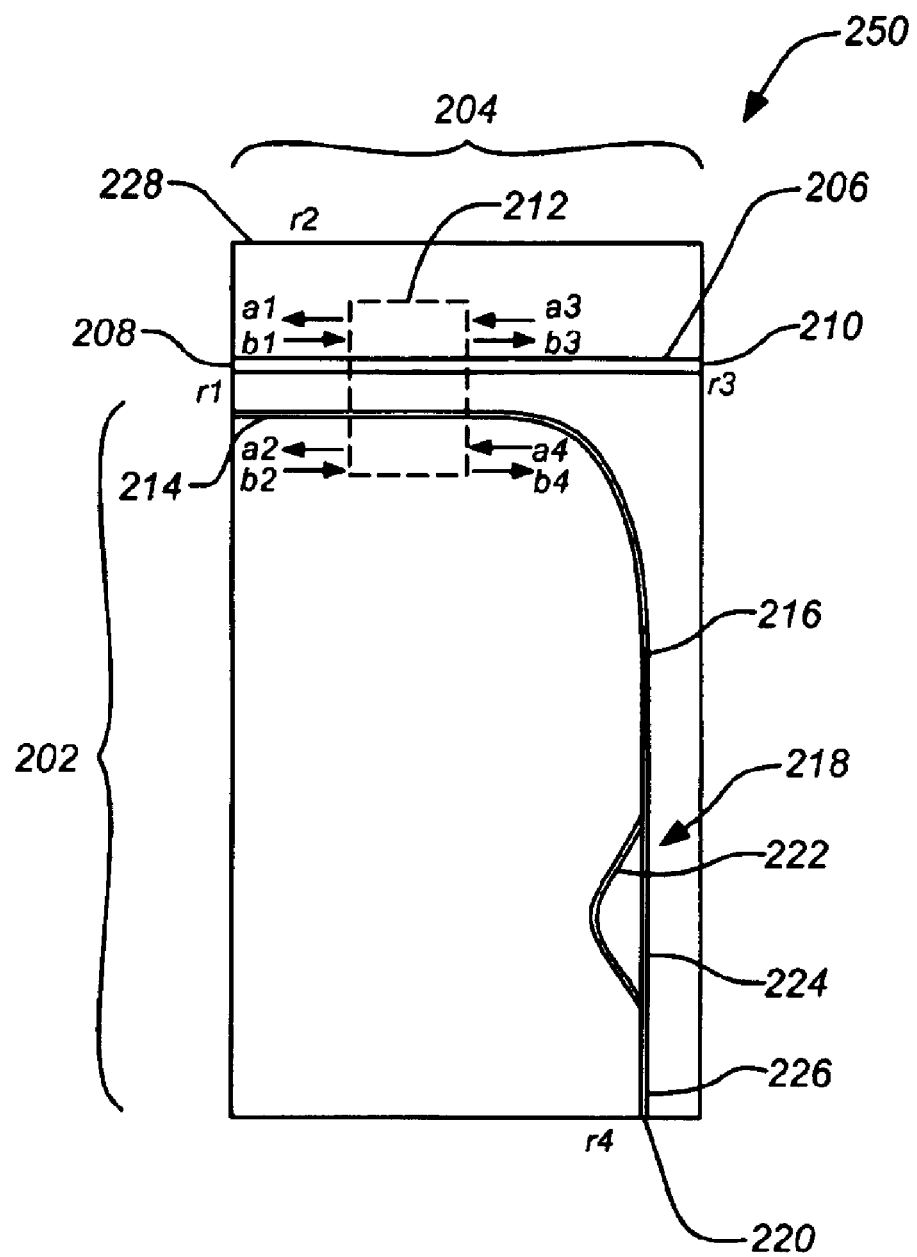
FIG. 2D illustrates a top view of a third tunable laser embodiment of the present invention including a tunable element having two waveguides, a MZI and a reflective facet.

FIG. 2D illustrates a top view of a third tunable laser embodiment of the present invention including a tunable element having two waveguides 214, 216, a MZI 218 and two reflective facets 208 and 220. This embodiment 250 is similar to that of FIG. 2A, however, the first waveguide 214 is coupled to the rear facet 208 of the active medium rather than the rear facet 220 of the passive medium. This embodiment 250 of the invention illustrates a hybrid based on the semi-ring Fabry-Perot resonator of FIG. 1A. This embodiment couples a first waveguide 214 and second waveguide 216 from coupling region 212 to different reflective facets. The second waveguide 216 is coupled to the rear facet 220 of the passive medium through the MZI 218 and a third waveguide 226. As defined herein, in a semi-ring Fabry-Perot resonator, two ends of a waveguide 104 are coupled to a common facet 106 shown in FIG. 1A. Thus, at least some of the advantages, e.g. manufacturing simplicity, are not afforded by the embodiment of FIG. 2D. However, a difference in the reflective facets is afforded by the embodiment of FIG. 2D. The invention is not limited to the specific examples shown.

Figure 2E:
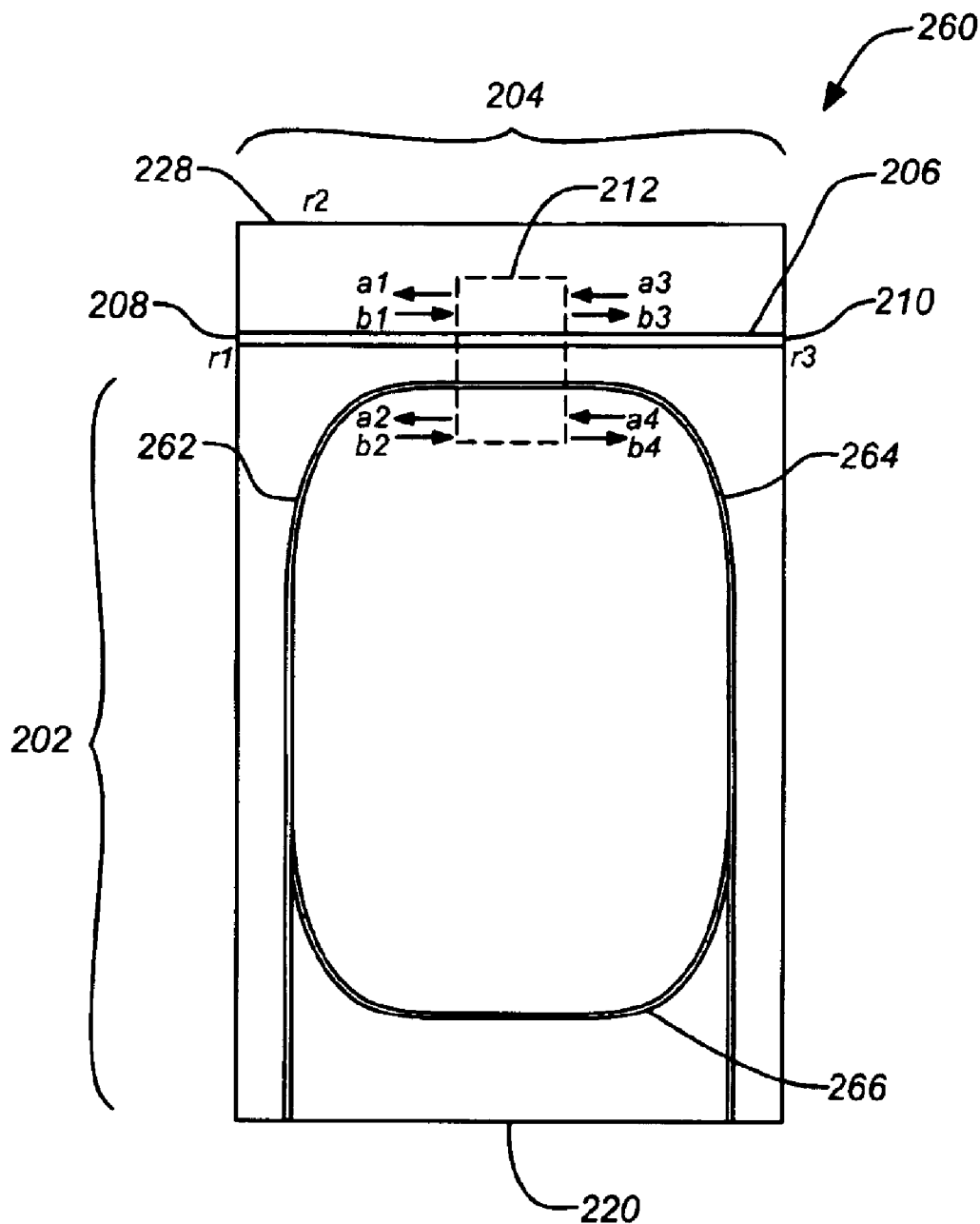
FIG. 2E illustrates a top view of a fourth tunable laser embodiment of the present invention including a tunable element having three waveguides and a reflective facet.

FIG. 2E illustrates a top view of a fourth tunable laser embodiment 260 of the present invention including a tunable element having three waveguides 262, 264 and 266 and a reflective facet 220. This embodiment 260 is another hybrid based on the semi-ring Fabry-Perot resonator of FIG. 1A in combination with a ring resonator. In this case, a first waveguide 262 and a second waveguide 264 are coupled from coupling region 212 to the rear facet 220 of the passive medium. In addition, a third waveguide 266 couples the two waveguides 262 and 266. The invention is not limited to the specific examples shown.

Figure 2F:
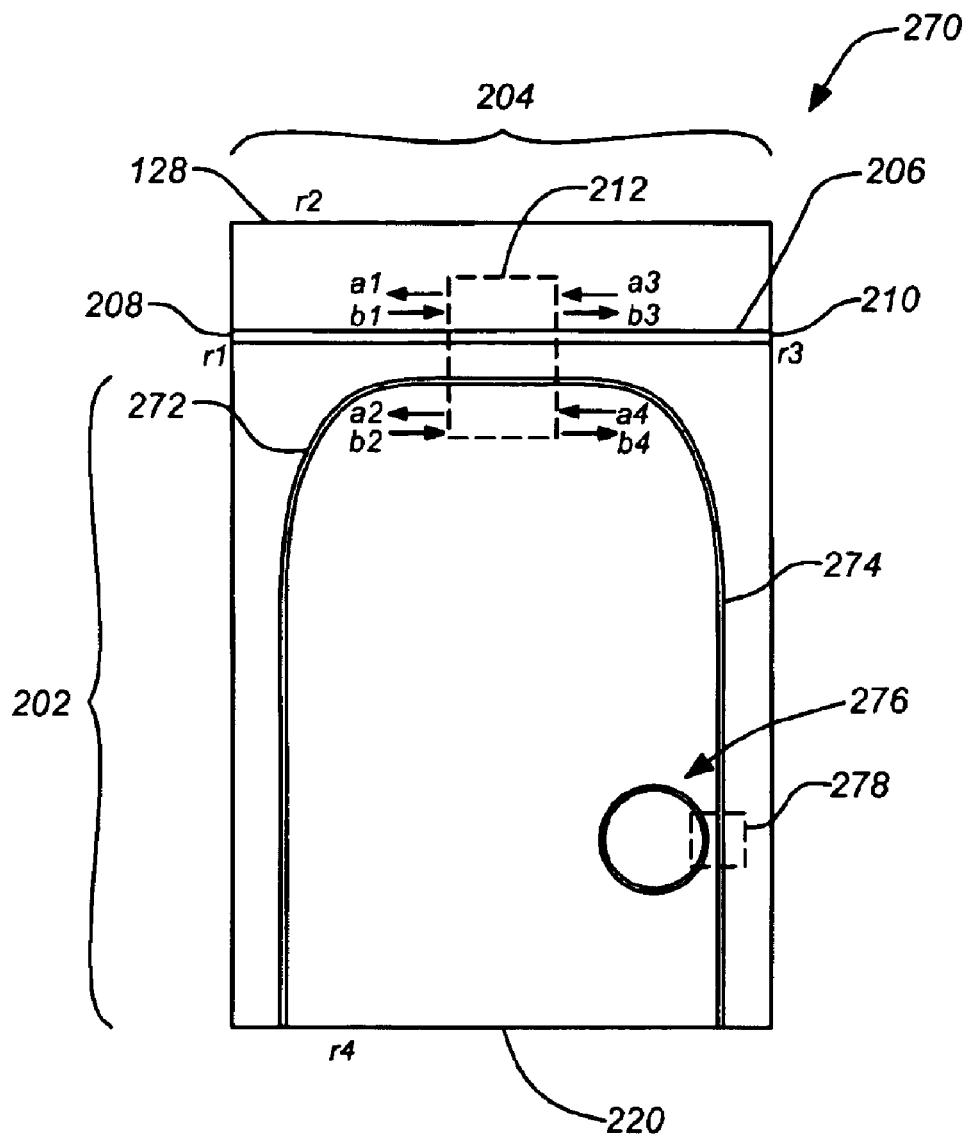
FIG. 2F illustrates a top view of a fifth tunable laser embodiment of the present invention including a SFRP tunable element having two waveguides, a ring resonator and a reflective facet.

FIG. 2F illustrates a top view of a fifth tunable laser embodiment 270 of the present invention including a SFRP tunable element having two waveguides 272, 274, a ring resonator 276 and a reflective facet 220. The ring resonator 276 included within the SRFP resonator (comprising the two waveguides 272, 274 and the reflective facet 220) of the tunable element 202 and coupled to the SRFP resonator by the second coupling region 278. Although the ring resonator 276 is shown positioned on the waveguide 274, the tunable element 202 can alternately be structured with the ring resonator 276 on the waveguide 272. Other equivalent structures are also possible.

The SRFP provides a first set of resonator frequencies and the ring resonator provides another set of resonator frequencies. The combined resonant frequency of the tunable element 202 will be the ones which coincide with both the ring and the the SRFP. Also, it should be noted that the effect of a back reflection (r1≠0) for the embodiment 270 shown in FIG. 2F is to improve the performance of the resonator in terms of reflection (b3/a3) and FSR (which is defined as the spacing between two consecutive peaks of same intensity). This embodiment 270 may increase the FSR of the resonator by merely changing the back reflection (r1) instead of the resonator length.

4. Engineering a Single SRFP Tunable Laser

A general analysis of a single tunable frequency mirror (a semi-ring Fabry-Perot resonator) is presented above. This section is concerned with the engineering of the tunable frequency mirror together with the gain section in order to produce a widely tunable single-mode laser as described in FIG. 2A. Although embodiments of the invention can be constructed as hybrid devices with distinct elements separately fabricated and integrated together, the invention can advantageously be used to form optical devices through monolithic fabrication, in a simpler, cost effective manner.

One can examine a specific design in which the active medium is a III–V material system operating at approximately 1.55 $\mu$m wavelength. For this specific exemplary numerical application, a MZI free spectral range (FSR) of approximately 1,248 Ghz (equivalent to a tunability range of approximately 1,248 Ghz (10 nm)) is chosen. A fine wavelength selection of approximately 50 Ghz is considered. This is the frequency difference between two consecutive frequencies of the laser channels and, in turn, corresponds to the total combined length of waveguide 114, waveguide 116 and waveguide 124 of approximately 1 mm.

It can also be assumed that the gain medium is substantially removed from the tunable filter so that the waveguide loss reaches a maximum value of approximately 10 dB/cm, r1, r2 and r3 are substantially equal and equal to approximately 0.97, and K1 and K2 are substantially equal and equal to 0.7. The main reflection of the tunable filter is taken to correspond to a cavity mode, which is the laser mode. The 10 dB/cm loss is applied as a worst cast estimate for evaluation purposes; realistic losses are significantly lower in many applications, depending upon manufacturing and other considerations.

Referring to FIG. 2A, it is also assumed that the separation of the cavity modes is such that the reflection of the adjacent cavity mode from the tunable filter element 202 is lower than that of the cavity mode, coinciding with the next strongest reflection peak of the tunable filter element 202. In the calculation of the MSR, a worst scenario is assumed in which both the strongest and next strongest field reflection peak spectrum of the tunable filter element 202 correspond to a cavity mode. The contribution of the filter reflection to the energy stored in each mode only is included in order to calculate the single contribution of the tunable filter element 202 in the MSR. This means that these calculations represent a pessimistic view where the same gain is present both for the main and side mode. In reality, this is not truly the case and the gain is relatively flat for the side mode.

Figure 3:
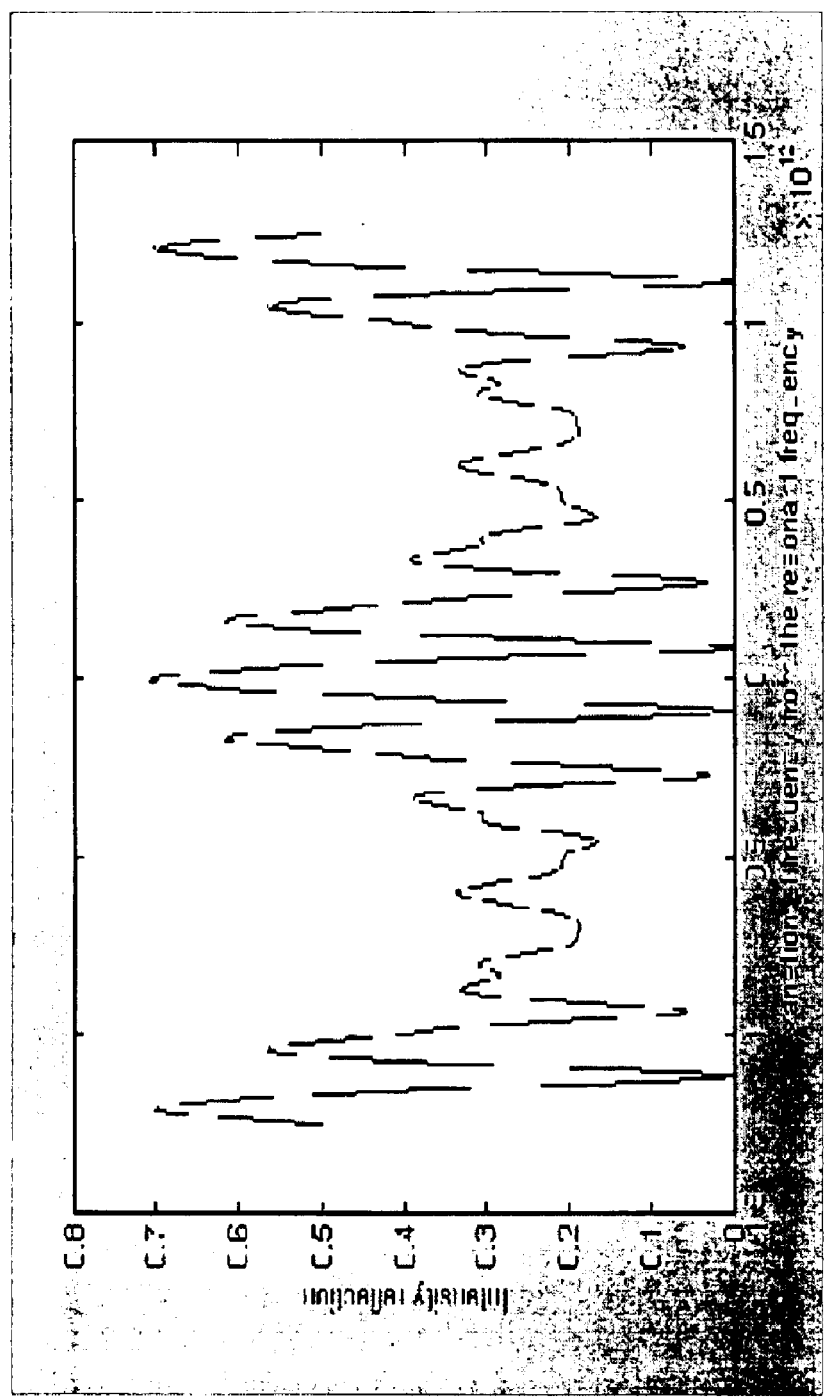
FIG. 3 illustrates the intensity coming back from the tunable frequency element versus frequency of the exemplary embodiment of FIG. 2A.

FIG. 3 illustrates the intensity coming back from the tunable frequency element versus frequency of the exemplary embodiment of FIG. 2A. A fine wavelength selection FSR of approximately 50 Ghz and a MZI FSR of approximately 1,248 Ghz are applied. In addition, an intensity coupling between the gain-tunable element of approximately 0.49 and a waveguide loss of approximately 10 dB/cm are also used.

The considered gain medium parameters of the exemplary embodiment of FIG. 2A are approximately 0.2 $\mu$m thickness, 3 $\mu$m width, 300 $\mu$m length and a material loss of approximately 80/cm. The gain versus carrier density characteristic of the active medium is associated with a transparency carrier of approximately 5×10$^{-16}$ cm$^3$.

According to L. Coldren et al., "Diode Lasers and Photonic Integrated Circuits", p. 45, 1995, which is incorporated by reference herein, the threshold current is given by, $$I_{th} \approx \frac{qVBN_{tr}^2}{\eta_i} e^{2(\langle \alpha_i \rangle + \alpha_m)/\Gamma g_0}, \quad (21)$$

where V is the volume of the device, $\eta_i$, the quantum efficiency (in our case its value is approximately 0.7), $N_{tr}$ is the transparent coefficient of approximately 2×10$^{18}$ cm$^{-3}$, $\alpha_i$ is the gain medium intrinsic loss, (approximately 80 cm$^{-1}$), B the bimolecular recombination coefficient (usually B∼10$^{-10}$ cm$^3$/s for most III–V materials of interest). A passive waveguide loss of approximately 10 dB/cm, a confinement factor $\Gamma$ of approximately 0.7 and a differential gain $g_0$ of approximately 5×10$^{-16}$ cm$^2$ are also applied. The mirror loss $\alpha_m$ is given by the following $$\alpha_m = \frac{1}{L_{activemedium}} \ln\left(\frac{1}{r_3 r}\right), \quad (22)$$

where, $$r_3 = \left|\frac{b_3}{a_3}\right|. \quad (23)$$

$r_3$ is the reflectivity from the strongest peak of the tunable frequency mirror, r=0.3922 is the output facet field reflectivity of the tunable laser 100.

Figure 4:
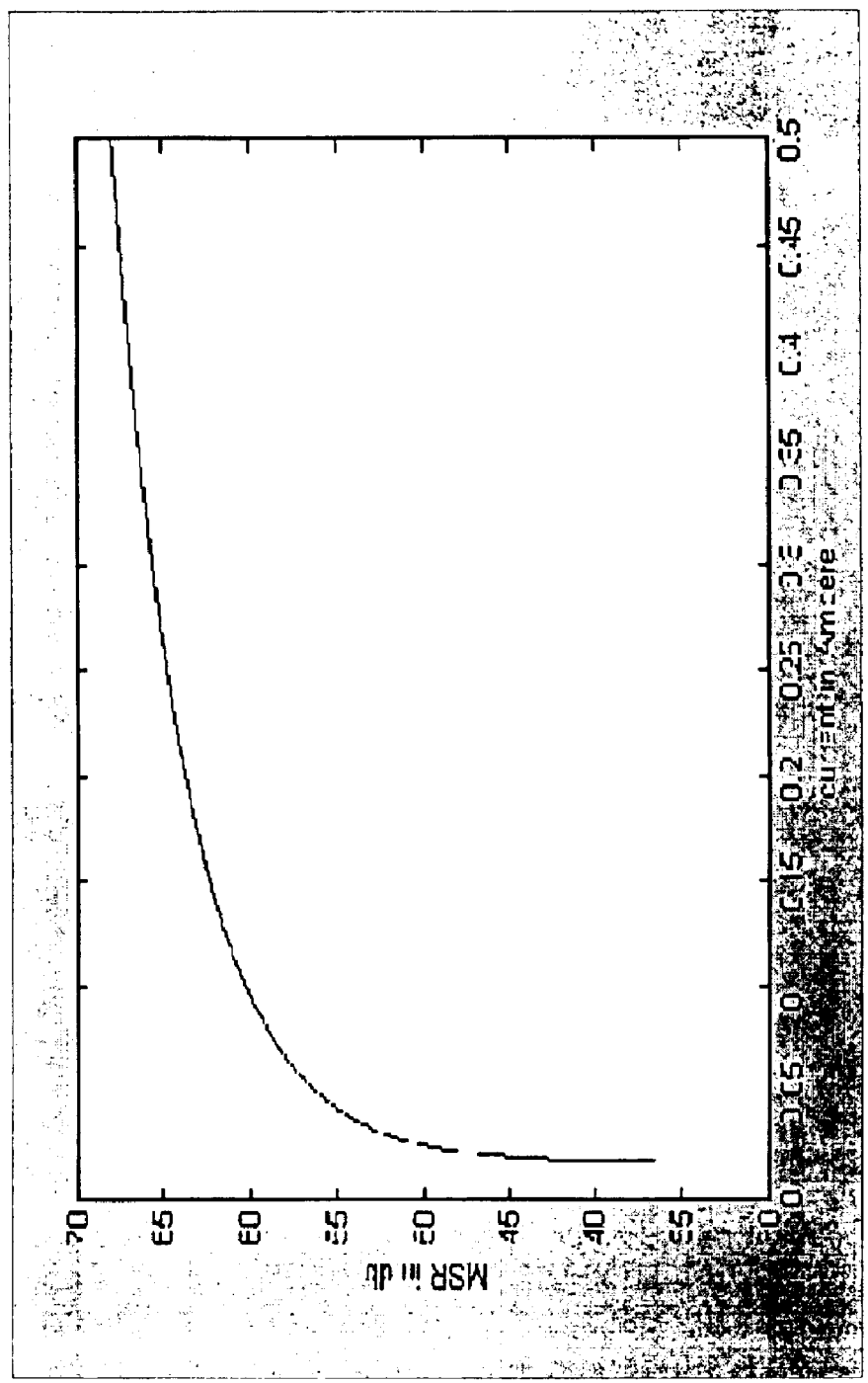
FIG. 4 is a plot of the Mode Suppression Ration (MSR) versus the current in Amperes for the exemplary embodiment of FIG. 2A.

FIG. 4 is a plot of the Mode Suppression Ration (MSR) versus the current in Amperes for the exemplary embodiment of FIG. 1B. According to L. Coldren et al., p. 107, Ibid., the Mode Suppression Ratio (MSR) can be given by, $$MSR(dB) \approx 10\log_{10}\left[\frac{\Delta \alpha + \Delta g}{\partial G} + 1\right], \quad (24)$$

where $\partial G$ is the separation between the mirror loss and the net modal gain for the main mode and is given by, $$\partial G \approx \frac{10^{-3} I_{th}}{I - I_{th}} cm^{-1}. \quad (25)$$

$\Delta \alpha$=91.4 m$^{-1}$ is the loss margin and $\Delta g$=0 is the modal gain margin. Proceeding in this way, $I_{th}$=20.2 mA.

Figure 5:
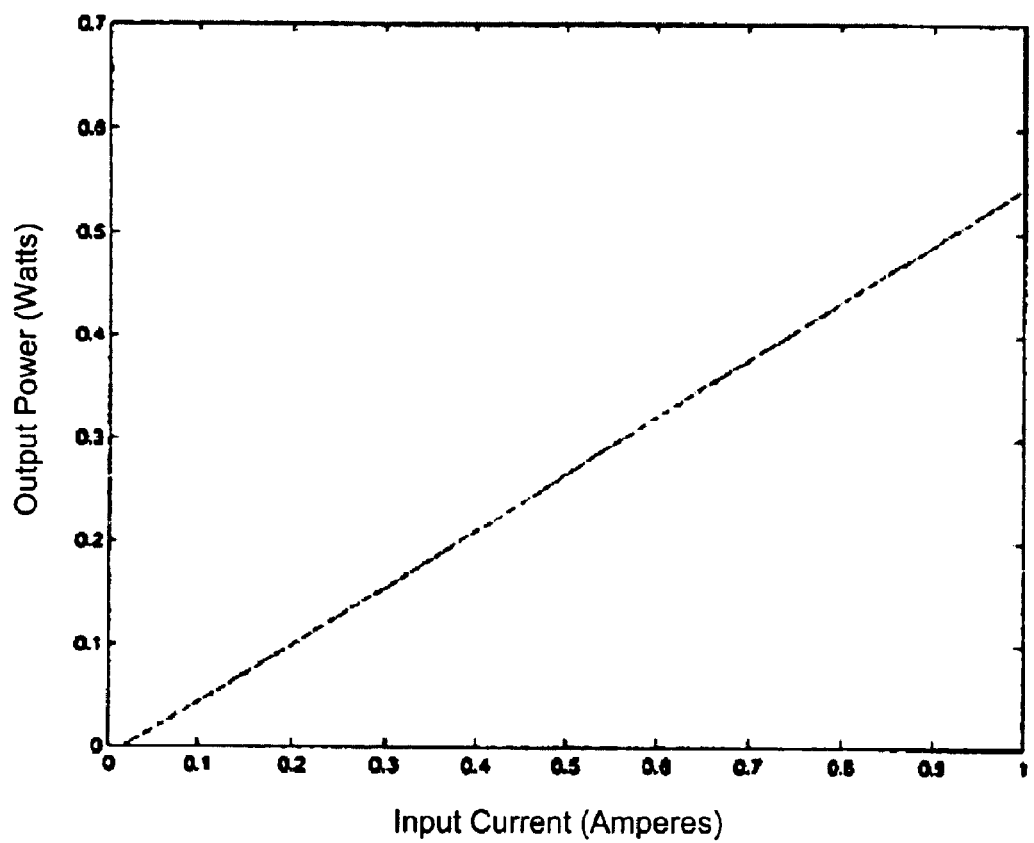
FIG. 5 is a plot of the output power in Watts versus the input current in Amperes for the exemplary embodiment of FIG. 2A.

FIG. 5 is a plot of the output power in Watts versus the input current in Amperes for the exemplary embodiment of FIG. 1A. The output power is given by L. Coldren et al., p. 42, Ibid.

$$P_0 = \eta_i \left(\frac{\alpha_m}{\langle \alpha_i \rangle + \alpha_m}\right) \frac{h\nu}{q} (I - I_{th}) \text{ for } I > I_{th}. \quad (26)$$

where h is Planck's constant.

5. Exemplary Embodiments of a Laser Using Multiple Resonators

Further embodiments of the invention comprise laser structures employing multiple optical resonators. The novel SRFP resonator is particularly useful in some of the laser structures described hereafter. Two foundational classes of laser embodiments are described herein, a class of laser including two optical resonators on opposing sides of a length of gain medium where one of the resonators is an SRFP resonator and a novel class of laser including two optical resonators on the same side of a length of gain medium. Further hybrids of these two classes are described as three or four optical resonators used in combinations on opposing sides of a length of gain medium. As with the single SRFP and other laser embodiments above, these embodiments can be monolithically fabricated.

Figure 6A:
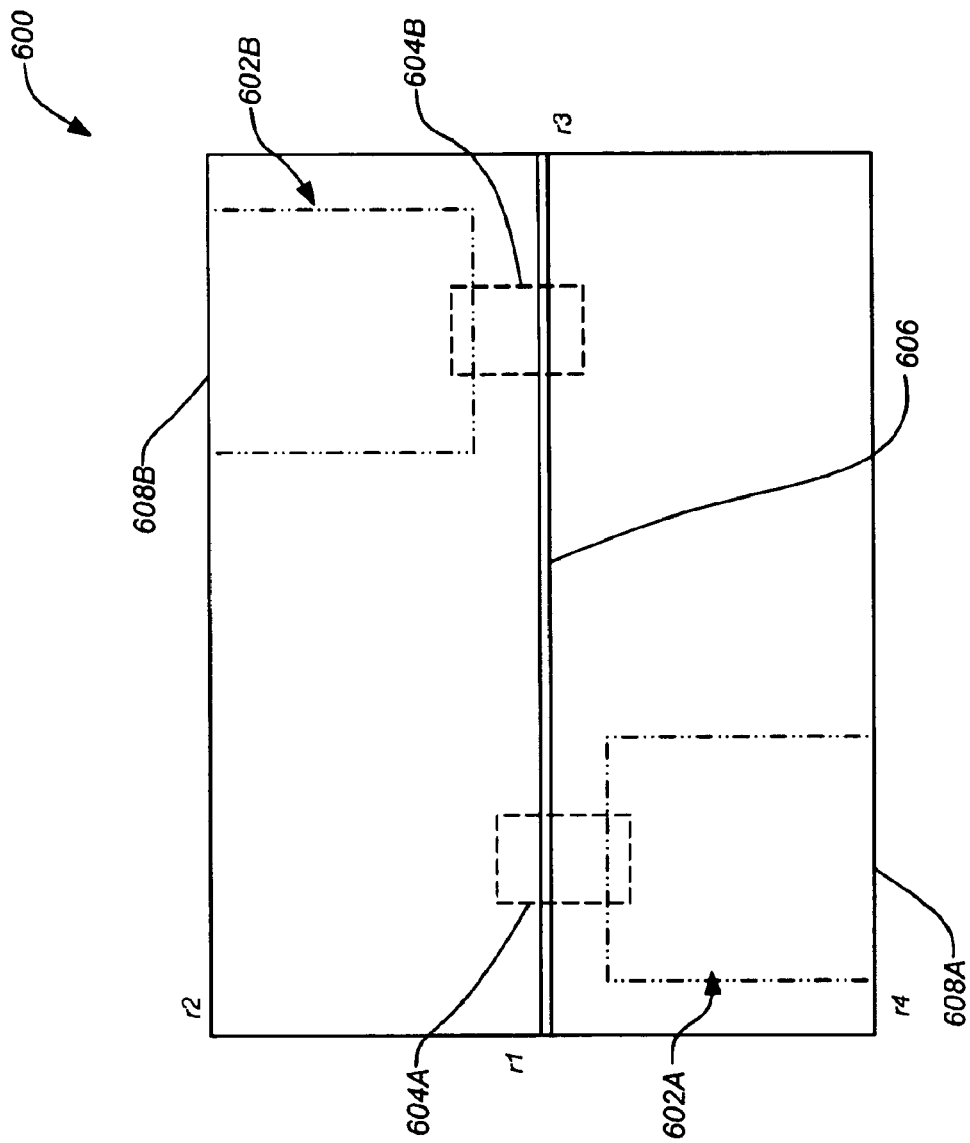
FIG. 6A illustrates a laser class including two optical resonators on opposing sides of a gain medium.

5.1 Using at Least One SRFP Resonator With Resonators on Opposite Sides of the Gain Medium FIG. 6A illustrates a class of laser 600 including two optical resonators 602A, 602B on opposing sides of a length of gain medium 606, i.e. the towards the left and right ends of the gain medium 606. Previous lasers have employed a gain medium bounded by optical resonators such as gratings. However, in embodiments of the present invention, at least one of the optical resonators 602A, 602B comprises a SRFP resonator as previously described. This defines a novel class of monolithic tunable semiconductor lasers. The lasers use the Vernier effect for the tunability. The lasing mode is the one that is a mode of both resonators 602A, 602B. The tunability of the laser 600 can be obtained by shifting the resonator modes of at least one of the two resonators 602A, 602B.

In addition, in further embodiments of the invention, the optical resonators 602A, 602B can be disposed on opposing sides of a width of gain medium 606. In the case of SRFP resonators, which employ side facets 608A, 608B, this allows separate adjustment and design of each resonator 602A, 602B. Some exemplary embodiments of the class of lasers of FIG. 6A are shown in FIGS. 6B–6G as follows.

As discussed above, further embodiments of the invention include a new type of tunable semiconductor laser using an optical resonator on each side of a gain medium. At least one of the optical resonators comprises a SRFP resonator as previously described. The tunable laser can be visualized as the combination of a gain medium bounded two reflectors, i.e., the resonators. One of the reflectors can be envisioned as a tunable filter element. As before, the nature of the coupling between the gain medium and the two resonators is not critical for the study of the device. For example, the nature of the coupling region can be evanescent coupling or multi mode couplers etc.

Figure 6B:
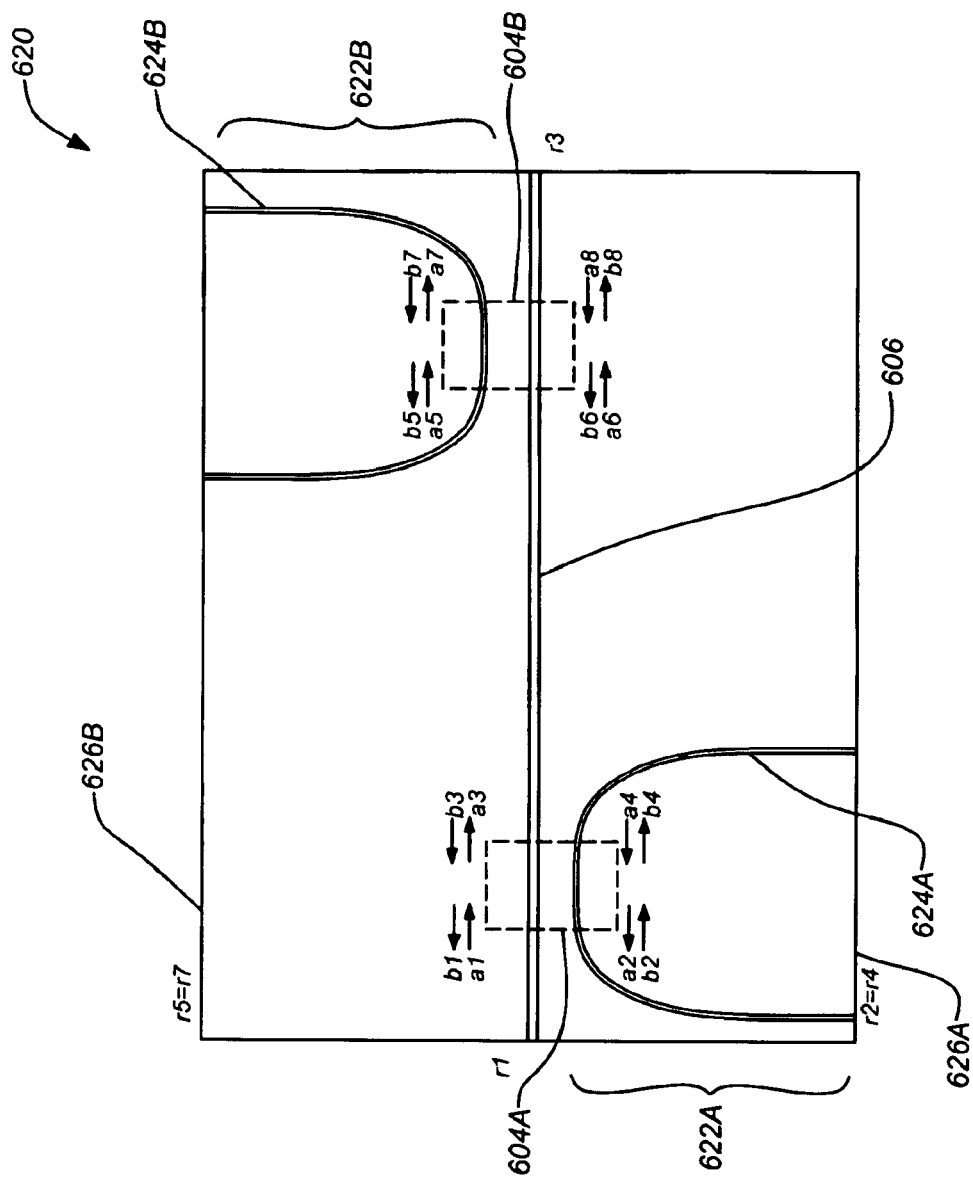
FIG. 6B illustrates a laser including two SRFP optical resonators on opposing sides of a gain medium.

FIG. 6B illustrates a top view of an exemplary laser embodiment 620 of FIG. 6A where both resonators comprise SRFP resonators 622A, 622B. The resonant frequencies of the laser 620 are those that correspond both to the resonant frequencies of the two SRFP resonators 622A, 622B and to a cavity mode of the gain medium 606. The frequency tunability of the laser 620 is obtained by changing the difference of optical path length of one of the SFRP resonators 622A, 622B to employ a Vernier effect.

As with the underlying SFRP resonators 622A, 622B, a laser 620 according to the embodiment of FIG. 6B employs relatively simple fabrication technology and does not require any grating structure or moving parts. When compared with a known double ring resonator coupled laser (DR-RCL), the waveguides 624A, 624B of the SFRP resonators 622A, 622B obtain lower curvature. See e.g., Bin Liu, Ali Shakouri, E. Bowers "Wide Tunable Double Ring Resonator Coupled Lasers", IEEE Photonics Technology Letters, Vol. 14, No. 5, May 2002 which is incorporated by reference herein. This not only better facilitates fabrication but also reduces the losses related to the bending of the waveguides 624A, 624B. Also, because the FSR of resonators in general is inversely proportional to the length of the cavity, if a high FSR resonator is desired, the length of the resonator should be decreased. In the case of ring resonators, the minimum affordable length of the resonator will be substantially determined by the waveguide's bending loss. Because the waveguide's bending is lower in the present SFRP resonators 622A, 622B than in ring resonators, a higher resonator FSR should be obtainable with the laser 620 shown in FIG. 6B.

The laser 620 comprises three main regions, a gain medium 606 and two passive SRFP resonators 622A, 622B. There are different techniques for coupling the gain medium to the SRFP resonators as previously discussed. However, the nature of the coupling is not critical for the analytical study of the laser 620. The gain medium 606 provides light amplification. Each SRFP resonator 622A, 622B cavity includes waveguides $\{q\}$ and $\{q+2\}$ with q=$\{2,5\}$. These correspond to the left and right portions of each of the wavguides 624A and 624B from their respective coupling regions 604A and 604B. Each respective facet is the high reflection facet q 626A, 626B. Each SRFP resonator 622A, 622B has a uniform peak transmission at all resonant peaks. Their FSR is related to their optical length.

The two SRFP have slight different optical length, thus providing the mode selection and the wavelength tuning mechanism. Therefore, the two SRFP resonator 622A, 622B tuning technique (which is based on the Vernier technique) is achieved by aligning the peaks in the two sets of resonator combs with the adjustment of index in one or both SRFP resonators 622A, 622B.

The proposed device can be compared to both the known sampled grating-distributed Bragg reflector (SG-DBR) laser and to the double ring resonator coupled laser (DR-RCL). However, in the laser 620 uses SRFP resonators 622A, 622B on opposing sides of the length of gain medium 606. In contrast, SG-DBR lasers employ sampled gratings on opposite sides of a length of gain medium and DR-RCL uses ring resonators on opposite sides of a length of gain medium.

One advantage of the SRFP resonator over the standard ring resonator is its support of standing waves (and larger waveguide bending curvature as previously discussed). This allows the device the use of only one coupling region in order to couple light from the SRFP resonator back to the gain medium. Further, the advantage of the SRFP resonator over the standard Fabry-Perot resonator is the use of only one facet. This eases the fabrication constraints on the SRFP resonator; the length of the SRFP may greatly differ from that of the chip.

Thus, the FSR of the SRFP resonator is not strongly dictated by fabrication requirements as with conventional Fabry-Perot resonators. As SRFP resonators produce a substantially uniform peak transmission at all resonant peaks, the uniform thresholds and efficiencies between the different operating wavelengths are substantially the same. Consequently, the laser 620 of FIG. 6B and the DR-RCL are nearly analytically equivalent and, accordingly, the laser 620 should exhibit at least the same advantages in term of performance (such as tunability and MSR) as the DR-RCL if manufactured properly. In addition, the laser 620 exhibits additional positive features. For example, the laser 620 allow a reduction in the number of coupling regions as well as the elimination of absorption regions. Indeed, reflection problems related to the discontinuity between the absorption region and the passive waveguide in DR-RCL devices are avoided. The presence of a non perfect high reflection facet (i.e. r4≠0) does not appreciably deteriorate the resonator response. Also, as previously mentioned, the overall design has the advantage of planar fabrication and does require any grating structure or moving parts.

Analysis and modeling of the coupling between the gain medium and the resonator in the laser 620 build on the analysis related to the SRFP resonator, in section 2 above. The matrix form normalized complex field amplitude equations for coupling region 604A is as equation (3) in section 2, above. Similarly, the matrix form normalized complex field amplitude equations for coupling region 604B is as follows.

$$\begin{pmatrix} b_5 \\ b_6 \\ b_7 \\ b_8 \end{pmatrix} = \begin{pmatrix} 0 & 0 & t_5(f) & K_5(f) \\ 0 & 0 & -K_5(f)^* & t_5(f)^* \\ t_6(f) & K_6(f) & 0 & 0 \\ -K_6(f)^* & t_6(f)^* & 0 & 0 \end{pmatrix} \begin{pmatrix} a_5 \\ a_6 \\ a_7 \\ a_8 \end{pmatrix} \quad (27)$$

In the structure of FIG. 6B, from equations (3) and (27), $$\frac{b_2}{a_2} = -K_1^* R_3[t_2 N + K_2] + t_1^* R_4[-K_2^* N + t_2^*] \text{ and} \quad (28)$$

$$\frac{b_6}{a_6} = -K_5(f)^* R_7[t_6 M + K_5] + t_5^* R_8[-K_6^* M + t_6^*],$$

where $$R_i = e^{-(2\alpha_i n_i L_i)} e^{j\frac{2\pi f}{c} 2 n_i L_i} r_i, \quad (29)$$

$$N = \frac{R_1 t_1 R_3 K_2 + K_1 R_4 t_2^*}{1 - R_1 t_1 R_3 K_2 + R_1 t_1 R_4 K_2^*} \text{ and}$$

$$M = \frac{R_5 t_5 R_7 K_6 + K_5 R_8 t_6^*}{1 - R_5 t_5 R_7 K_6 + R_5 t_5 R_8 K_6^*}$$

where $\alpha_i$, $n_i$ and $L_i$ are respectively, the loss per unit length, the refractive index and the length of the waveguide {i} and $r_i$ is the field reflectivity of the different facets as shown in FIG. 6B.

In the case of a tunable laser for WDM applications, one can neglect the frequency dependence of the coupling region over the working frequency range to obtain a rough approximation. Accordingly, it follows that, $$K_i = |K_i| e^{j\Phi_{k_i}}, \; t_i = |t_i| e^{j\Phi_{t_i}} \quad (11)$$

Figure 6C:
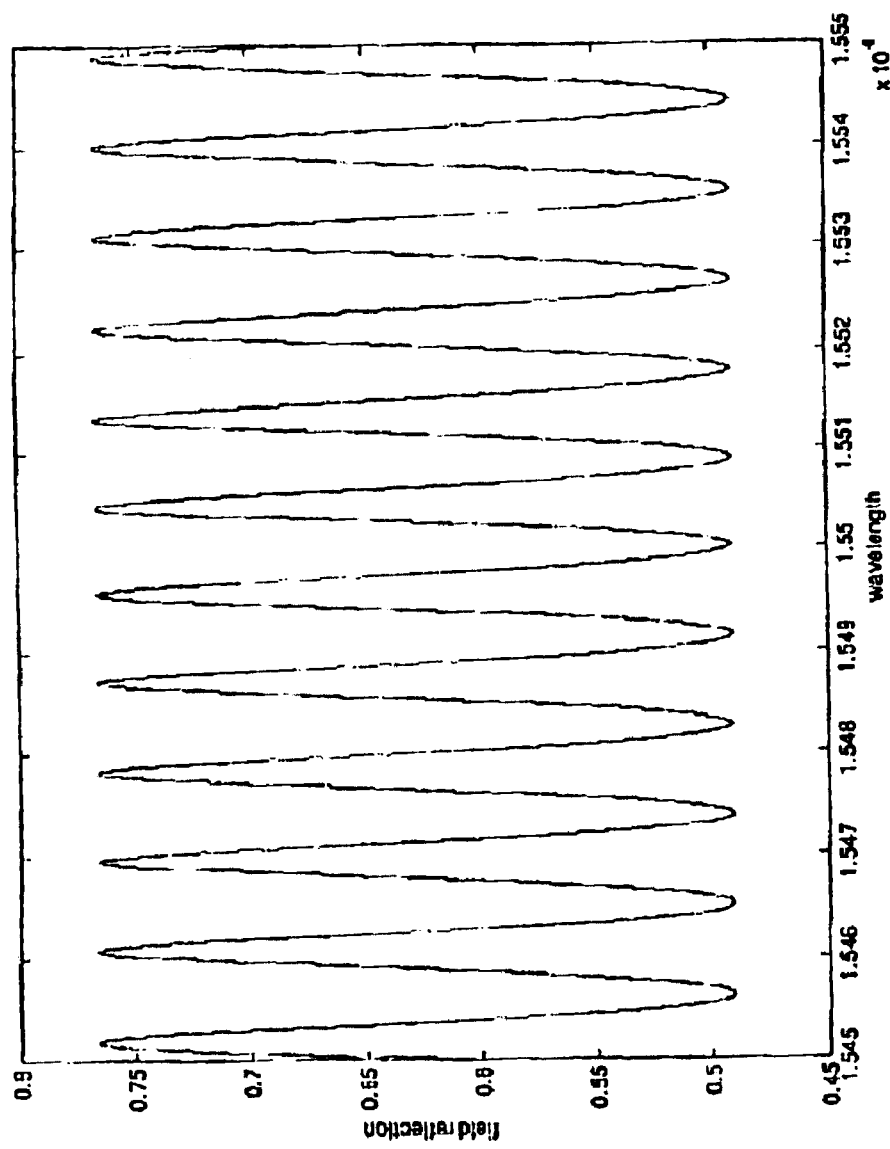
FIGS. 6C–6F are exemplary plots of the spectra of the light reflected from the resonator for different values of back reflection coefficients and high facet reflections.
Figure 6D:
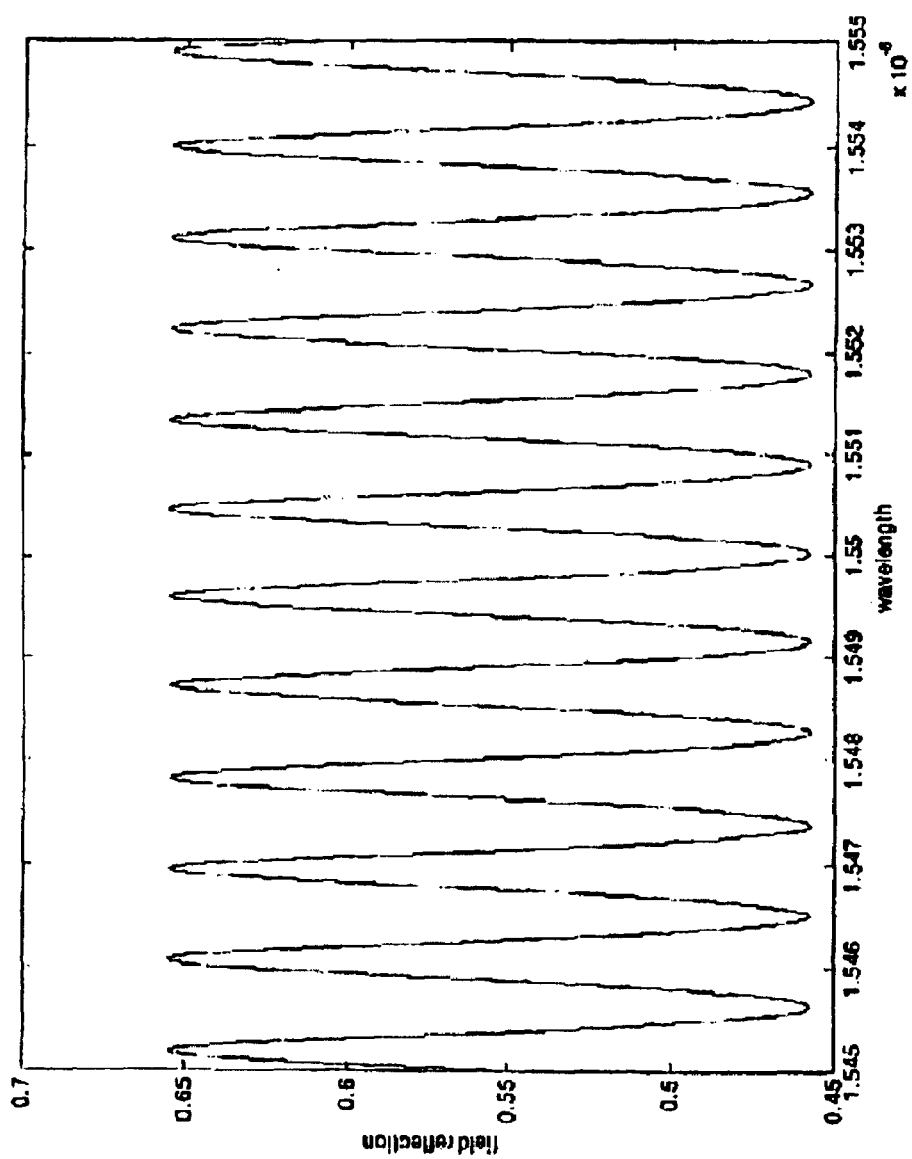
Figure 6E:
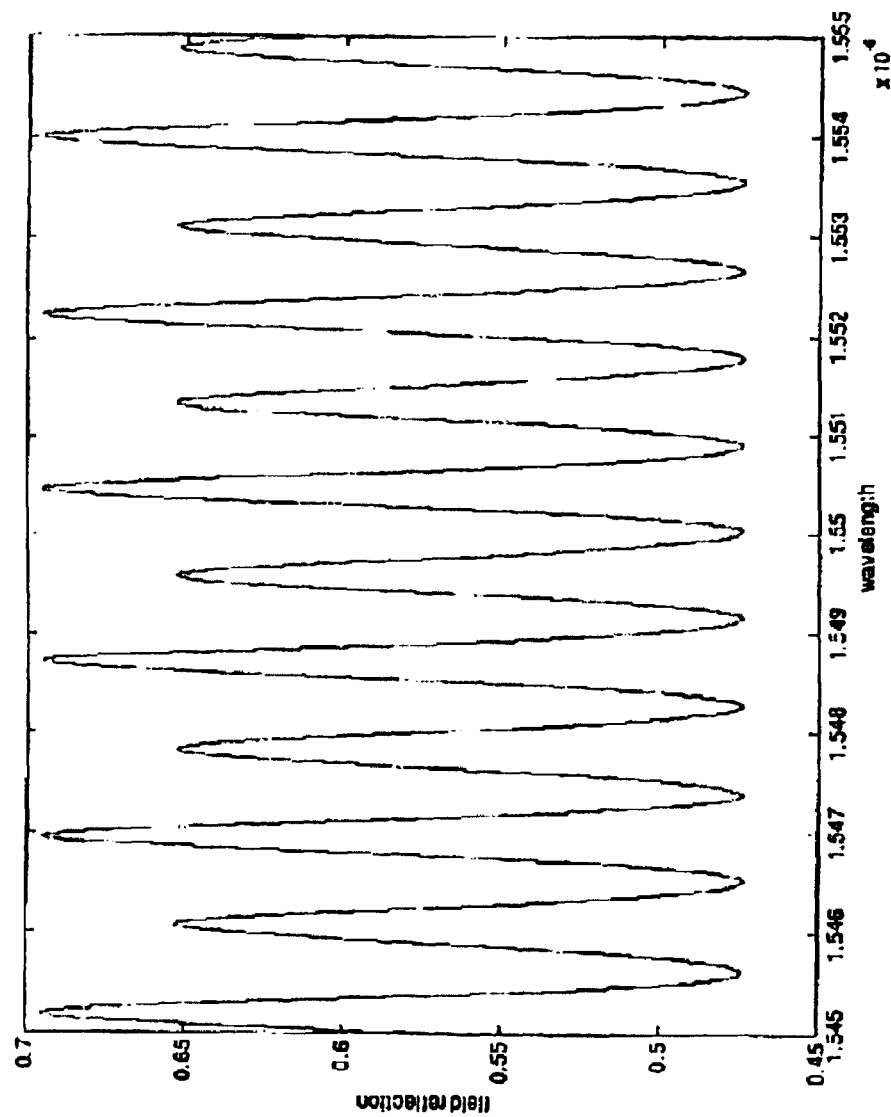

FIGS. 6C–6F are exemplary plots of the spectra of the light reflected from the resonator for different values of the back reflection coefficients (r1, r8), and high facet reflections (r2, r4, r5, r7). These plots demonstrate the effect of the coupling coefficient and the back reflection (that is r1 or r8) on the laser 620. FIG. 6C represents b3/a3 versus wavelength in the case where K1=K2=0.7 and r1=0, and a high reflection facet, r2=1. FIG. 6D represents b3/a3 versus wavelength in the case where K1=K2=0.7 and r1=0, and the high reflection facet r2=0.9. FIG. 6E represents b3/a3 versus wavelength in the case where K1=K2=0.7 and r1=0.1, and the high reflection facet r2=0.9. FIG. 6 represents b3/a3 versus wavelength the case where K1=K2=0.7 and r1=0.4, and the high reflection facet r2=0.9.

Figure 6F:
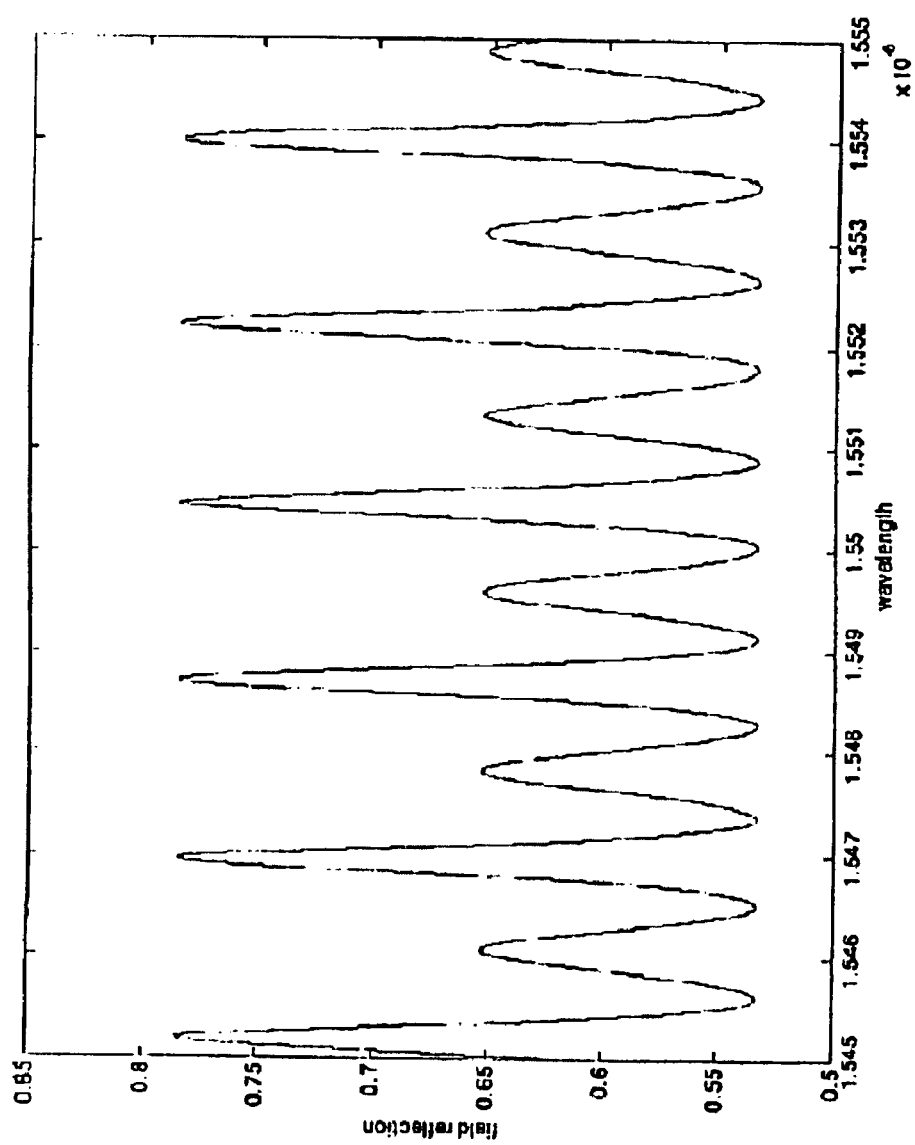

Notably, FIG. 6E shows that presence of a non perfect high reflection facet (r1≠0, r8≠0) does appreciably deteriorate the resonator response. Also, as shown in FIG. 6F, the effect of a back reflection (r4) is to improve the performance of the resonator in term of reflection b3/a3 and FSR (the spacing between two consecutive peaks of same intensity). Thus, the laser 620 offers the possibility of increasing the FSR of the resonator by merely changing the back reflection (r4) instead of the resonator length. Also, even if there is a reflection returning to the gain medium directly from the coupling region, the laser 620 will operate correctly up to the point where this is equal to the reflection returning from the filter b3/a3.

Figure 6G:
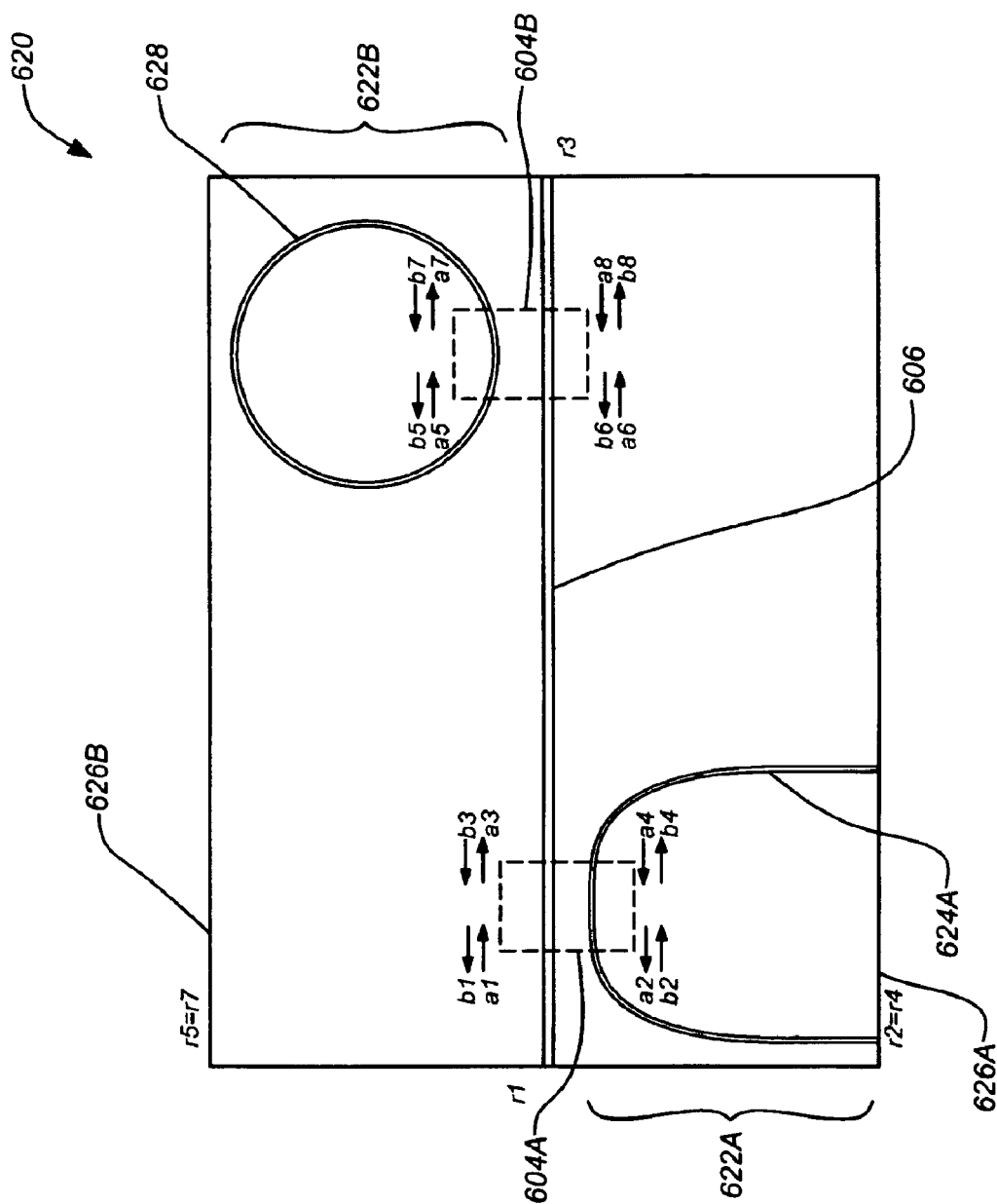
FIG. 6G illustrates a further embodiment where one of the SRFP resonators is replaced by a ring resonator.

FIG. 6G illustrates a further embodiment where one of the SRFP resonators is replaced by a ring resonator 628. Other alternate structures are also possible with at least one SRFP resonator on one side of the gain medium and another resonator form on the opposite side.

5.2 Using Multiple Resonators On One Side of the Gain Medium

Figure 7A:
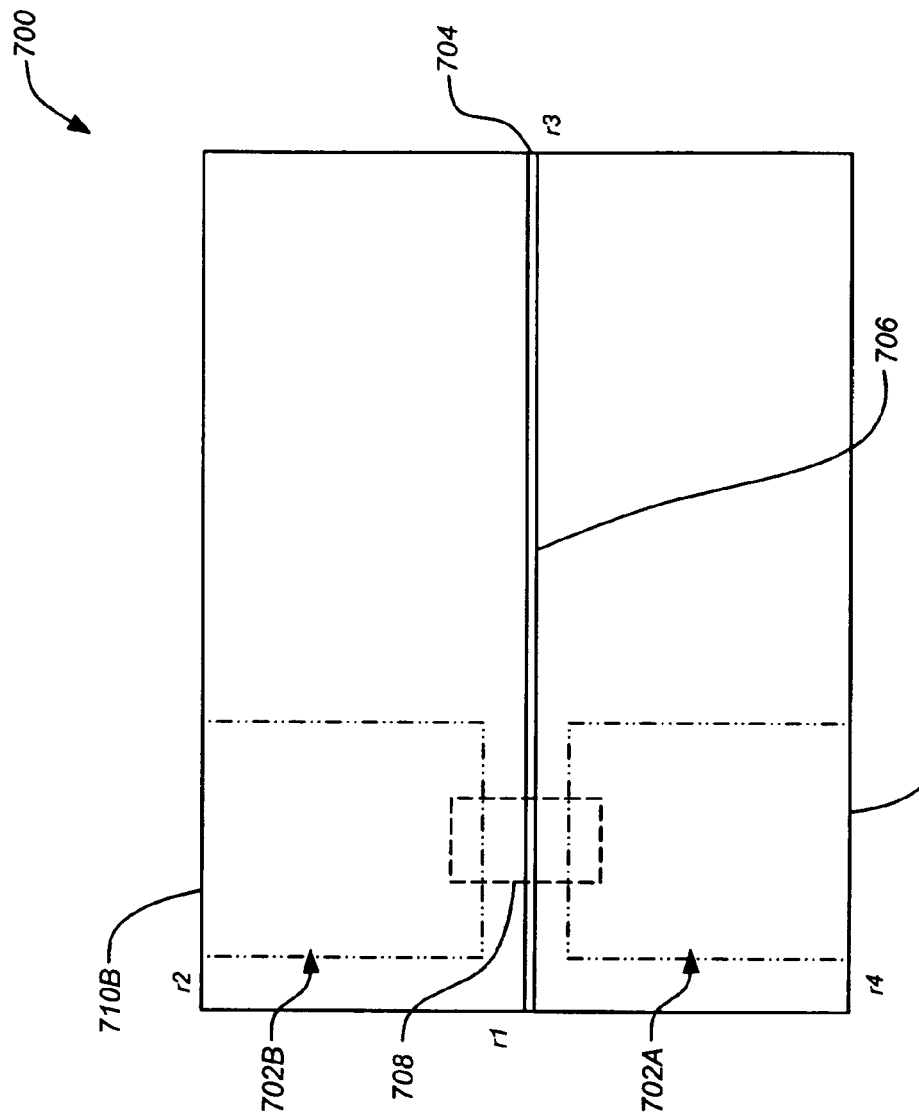
FIG. 7A illustrates a laser class including two optical resonators on the same side of a gain medium.

FIG. 7A illustrates a laser 700 including two paired optical resonators 702A, 702B on the same side of a gain medium. One of the drawbacks of many prior art lasers comprising resonators bounding a gain medium (excluding those employing at least one SRFP resonator described above) is that they may exhibit relatively low power levels due to the resonators, such as gratings, employed on both sides of the device. In such prior art lasers, each resonator is designed to reflect most of the light coupled into the resonator back to the gain medium. Consequently, the amount of the light coming out of the device is weak. In contrast, the laser 700 employs two paired optical resonators 702A, 702B on one side of the gain medium 706 and leaves the output facet 704 of laser 700 as a cleaved facet.

The Vernier techniques can still employed to provide tuning in the laser 700. Tuning of the class of devices described by FIG. 7A can be obtained by changing the resonator frequencies of at least one of the resonators. However, in order to be able to use the Vernier technique, the field from the gain medium 706 must travel between both resonators 702A, 702B before returning to the gain medium 706. Accordingly, a 3 by 3 coupling region 708 can be employed to accomplish this. The coupling region 708 couples light from the gain medium 706 to the resonators 702A, 702B and the gain medium 706 and from one resonators, e.g. 702A, to the other resonators, e.g. 702B, and the gain medium 706. For example, the coupling region 708 can be for example a 3*3 MMI coupler. The class of lasers of FIG. 7A have the advantage of providing both high MSR, high tunability and high power in a single laser device.

In further embodiments of the invention, either or both the resonators 702A, 702B can be either SRFP resonator. In the case of SRFP resonators, which employ side facets 710A, 7101B, this allows separate adjustment and design of each resonator 702A, 702B. Further, each SRFP can optionally include a MZI inside the resonator. In this case, as previously discussed, the free spectral range (FSR) of the resonator is increased because the FSR is substantially equal to that of the included MZI. Tuning can be obtained by changing the difference of optical length of the MZI. In addition, in still further embodiments, either resonator 702A, 702B can be ring resonator. Some exemplary embodiments of the class of lasers of FIG. 7A are shown in FIGS. 7B–7J as follows.

Figure 7B:
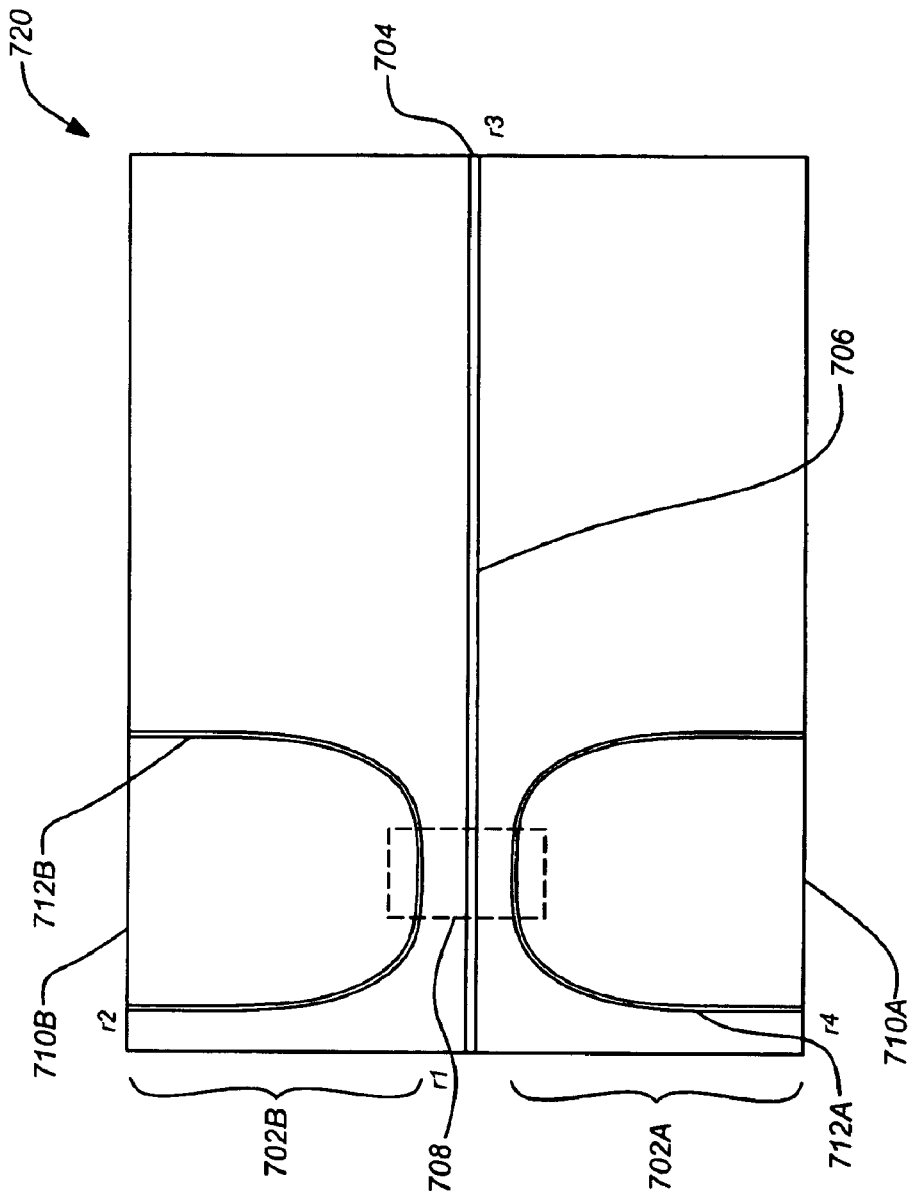
FIGS. 7B–7J illustrate various exemplary laser embodiments of the class of FIG. 7A.

FIG. 7B illustrates a top view of an exemplary laser embodiment 720 where the resonators 702A, 702B comprise SRFP resonators 712A, 712B. In general, the coupling region 708 can be designed to couple light from the two resonators 702A, 702B and the gain medium 706, i.e. light coming from one resonator, e.g. 702A, is coupled to the other resonator, e.g. 702B and the gain medium 706. Only the field which is both a resonator mode of the combination of resonator 702A, resonator 702B and the coupling region 708 is reflected back to the gain medium 706. Tuning can be obtained by changing the resonator modes of resonator 702A or resonator 702B or the modes of both resonators 702A, 702B. Similar to the embodiment of FIG. 6B, each SRFP resonators 712A, 712B in the exemplary laser 720 uses distinct high reflection facets 710A and 710B, respectively.

Figure 7C:
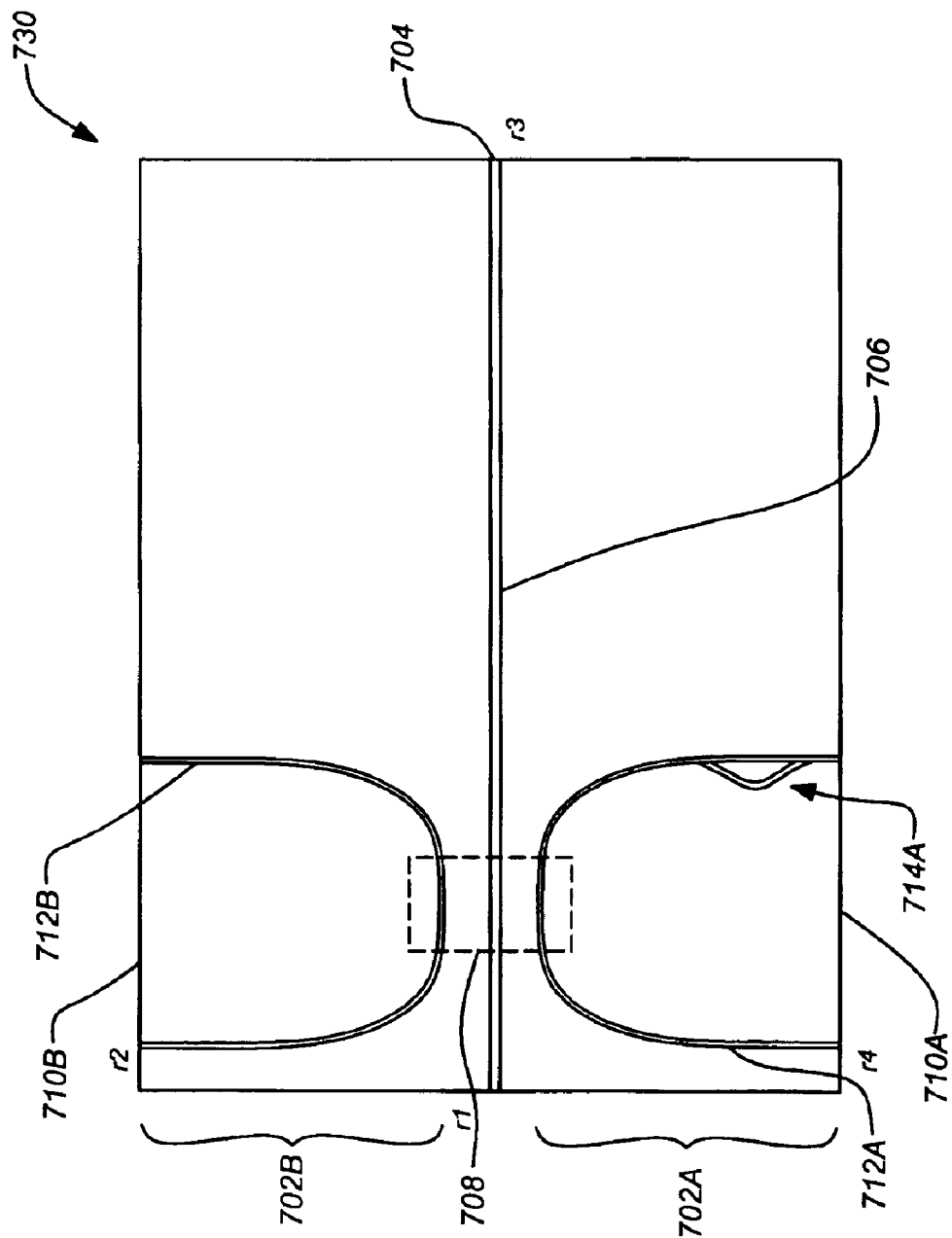

FIG. 7C illustrates a top view of a laser embodiment 730 employing two resonators 702A, 702B where resonator 702A comprises the combination of a MZI 714A inside a SRFP resonator 712A and resonator 702B comprises a SRFP resonator 712B. Alternately, the MZI 714A can be disposed on SRFP resonator 712A on the opposite side of the coupling region 708.

Figure 7D:
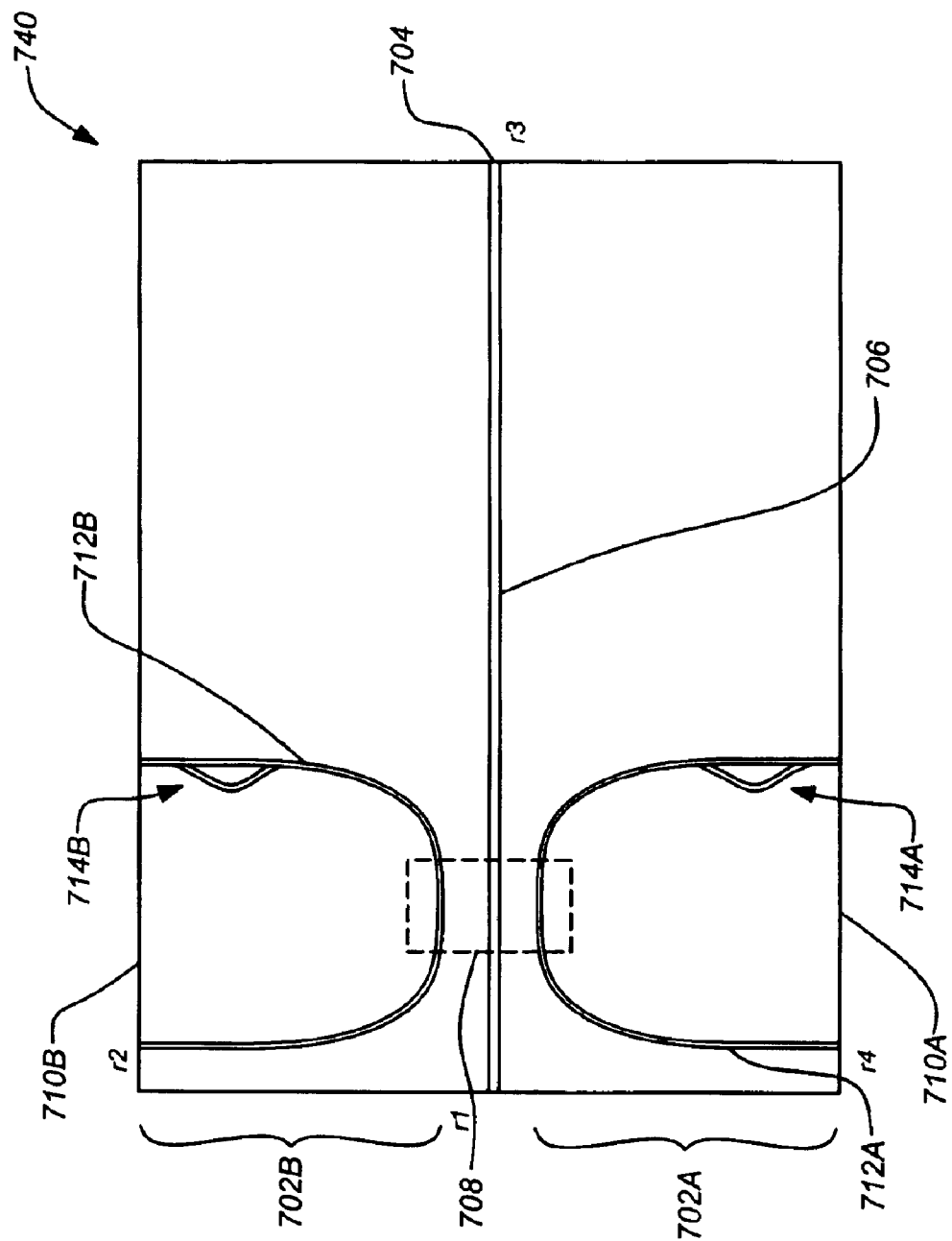

FIG. 7D illustrates a top view of a laser embodiment 740 where both resonators 702A, 702B are obtained with the respective combination of a MZI 714A, 714B inside SRFP resonator 712A and 712B. Alternately, either or both MZIs 714A, 714B can be disposed on their respective SRFP resonator 712A, 712B on the opposite side of the coupling region 708.

Figure 7E:
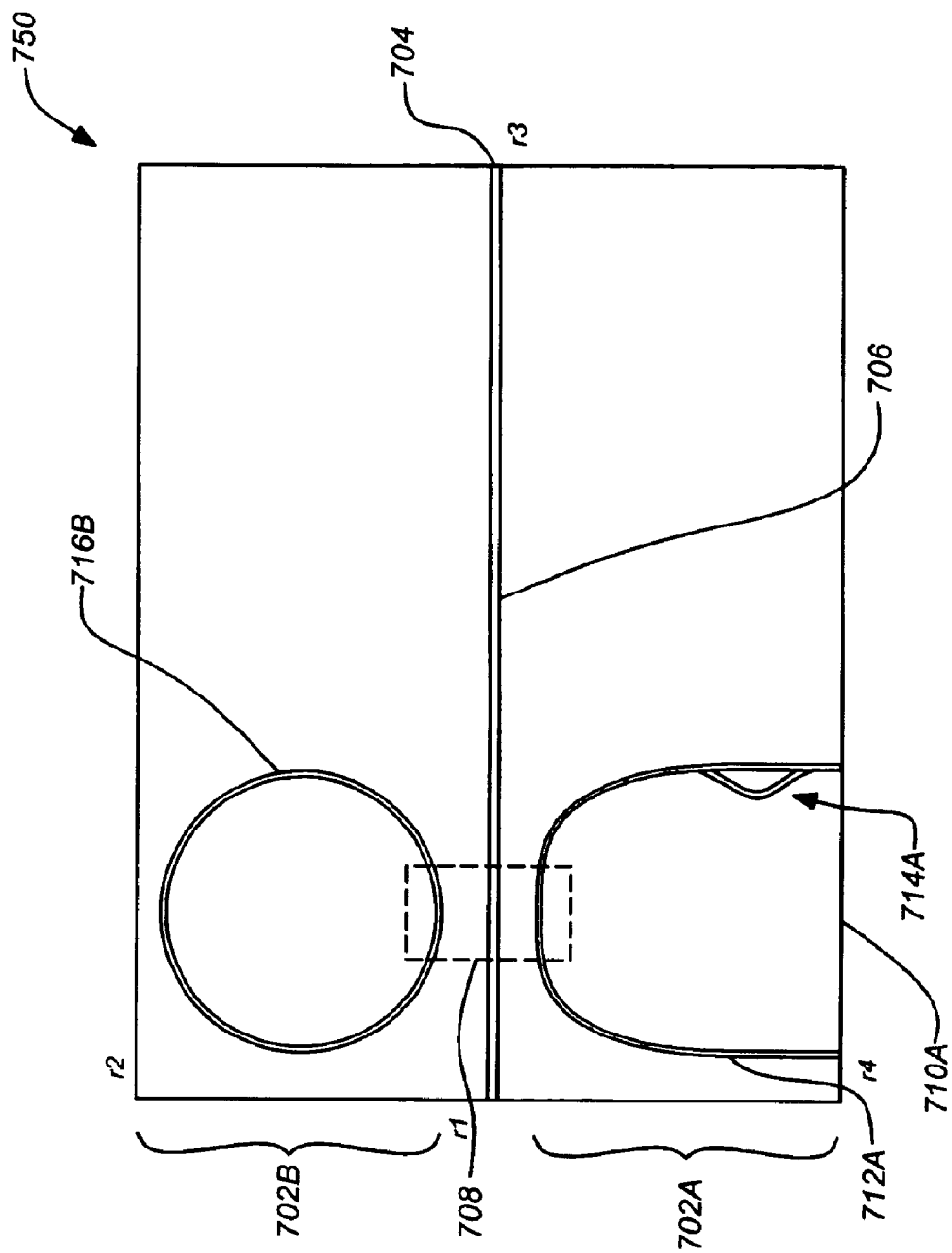

FIG. 7E illustrates a top view of a laser embodiment 750 where resonator 702A is obtained with the combination of a MZI 714A inside a SRFP resonator 712A and resonator 702B comprises a ring resonator 716B. As above, the MZI 714A can alternately be disposed on SRFP resonator 712A on the opposite side of the coupling region 708.

Figure 7F:
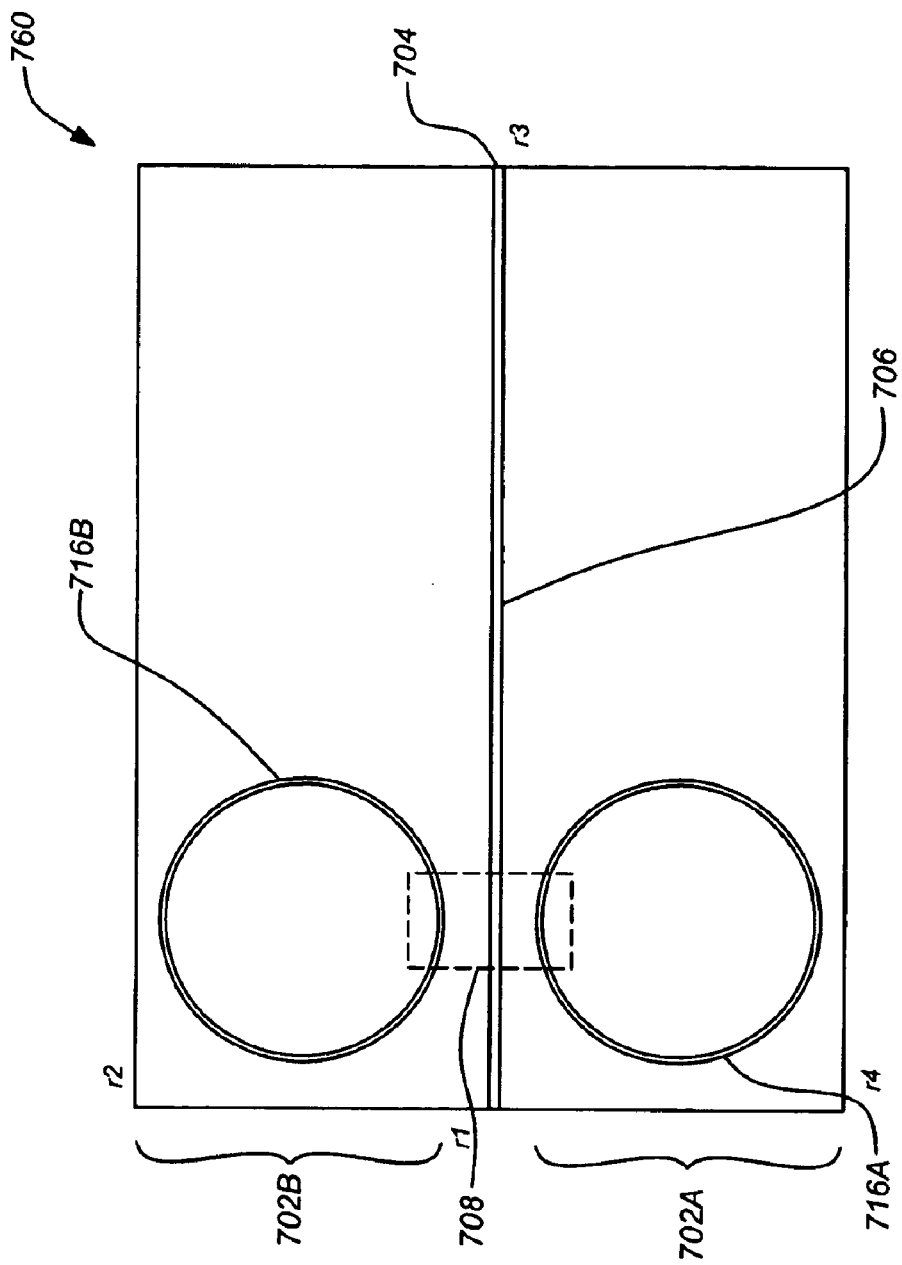

FIG. 7F illustrates a top view of a laser embodiment 760 where resonator 702A and resonator 702B both comprise ring resonators 716A, 716B.

Figure 7G:
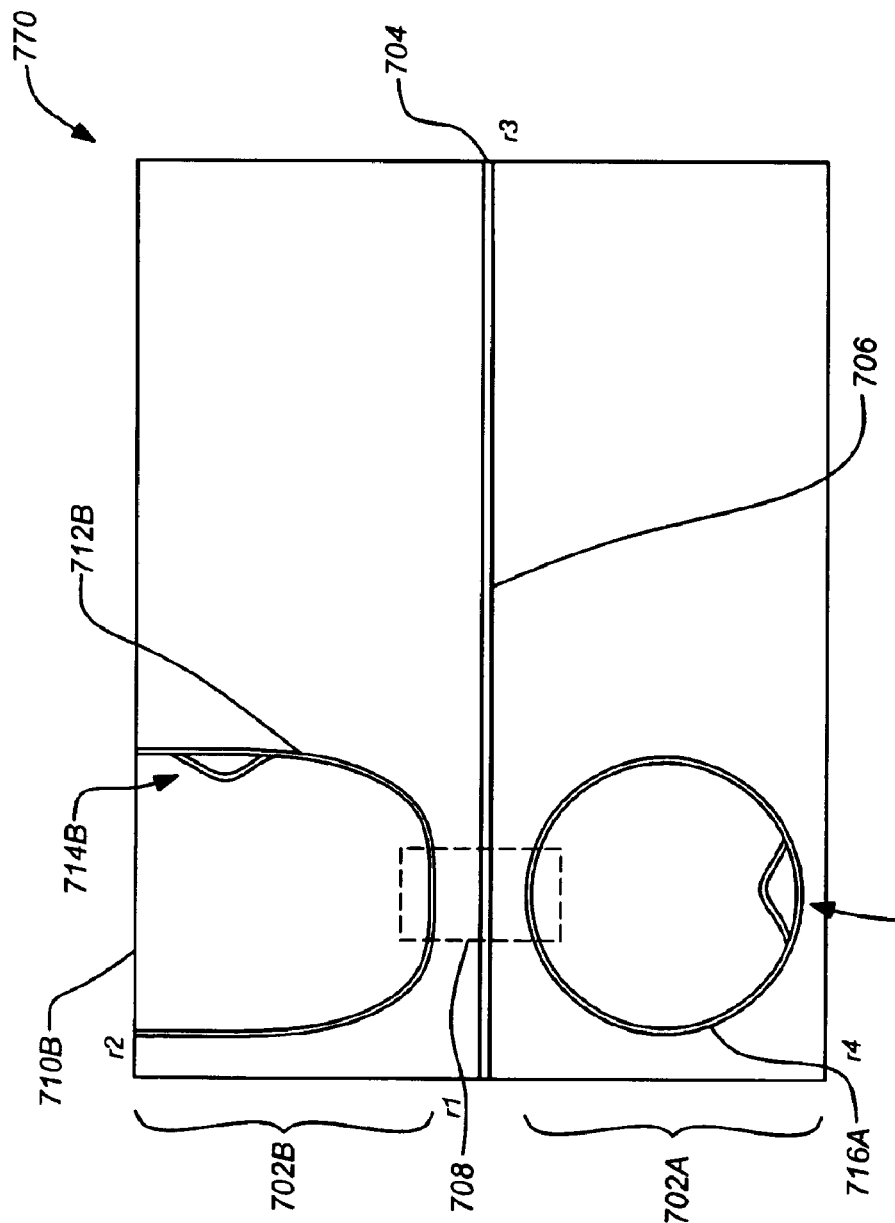

FIG. 7G illustrates a top view of a laser embodiment 770 where resonator 702A comprises a MZI 714A inside a ring resonator 716A and resonator 702B comprises a MZI 714B inside a SRFP resonator 712B.

Figure 7H:
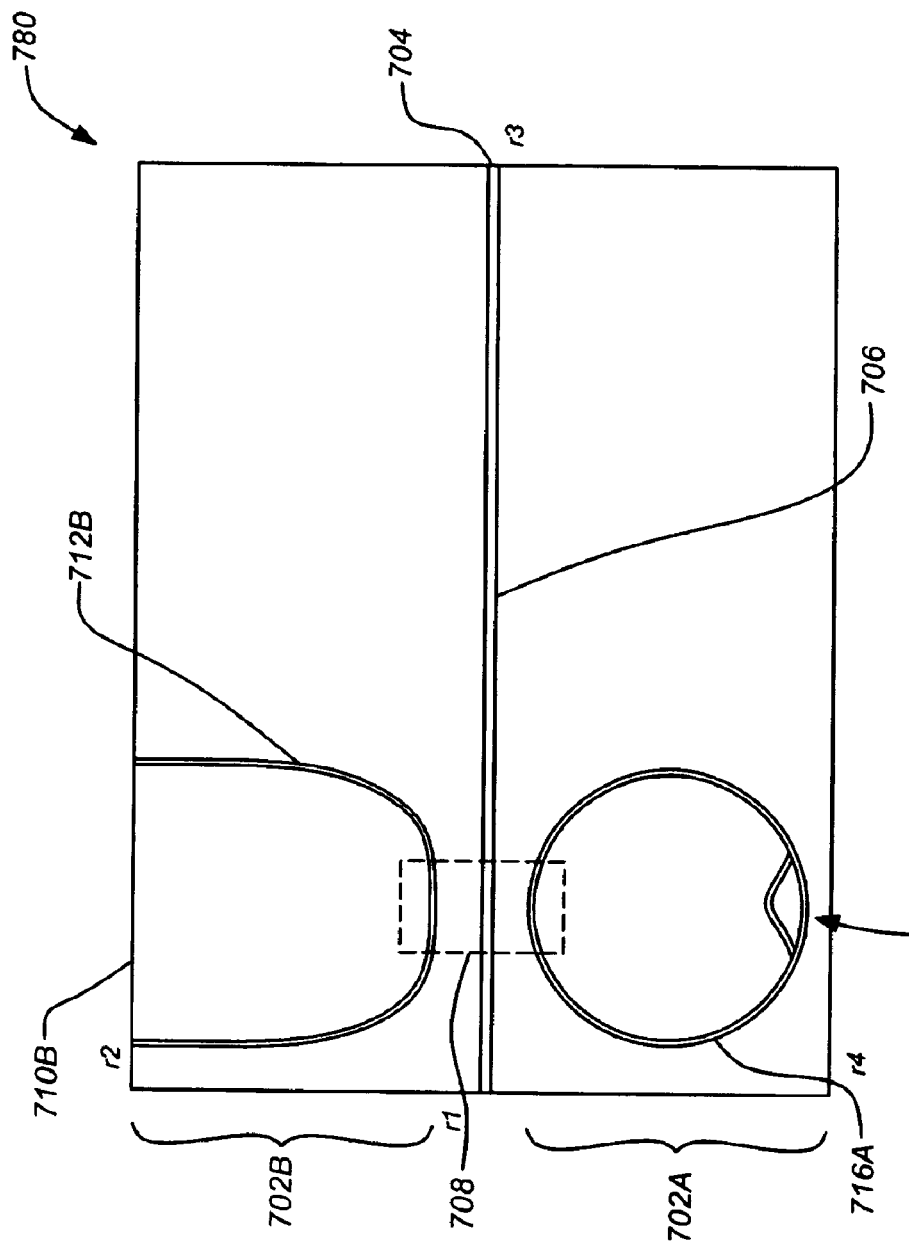

FIG. 7H illustrates a top view of a laser embodiment 780 where resonator 702A comprises a MZI 714A inside a ring resonator 716A and resonator 702B comprises a SRFP resonator 712B.

Figure 7I:
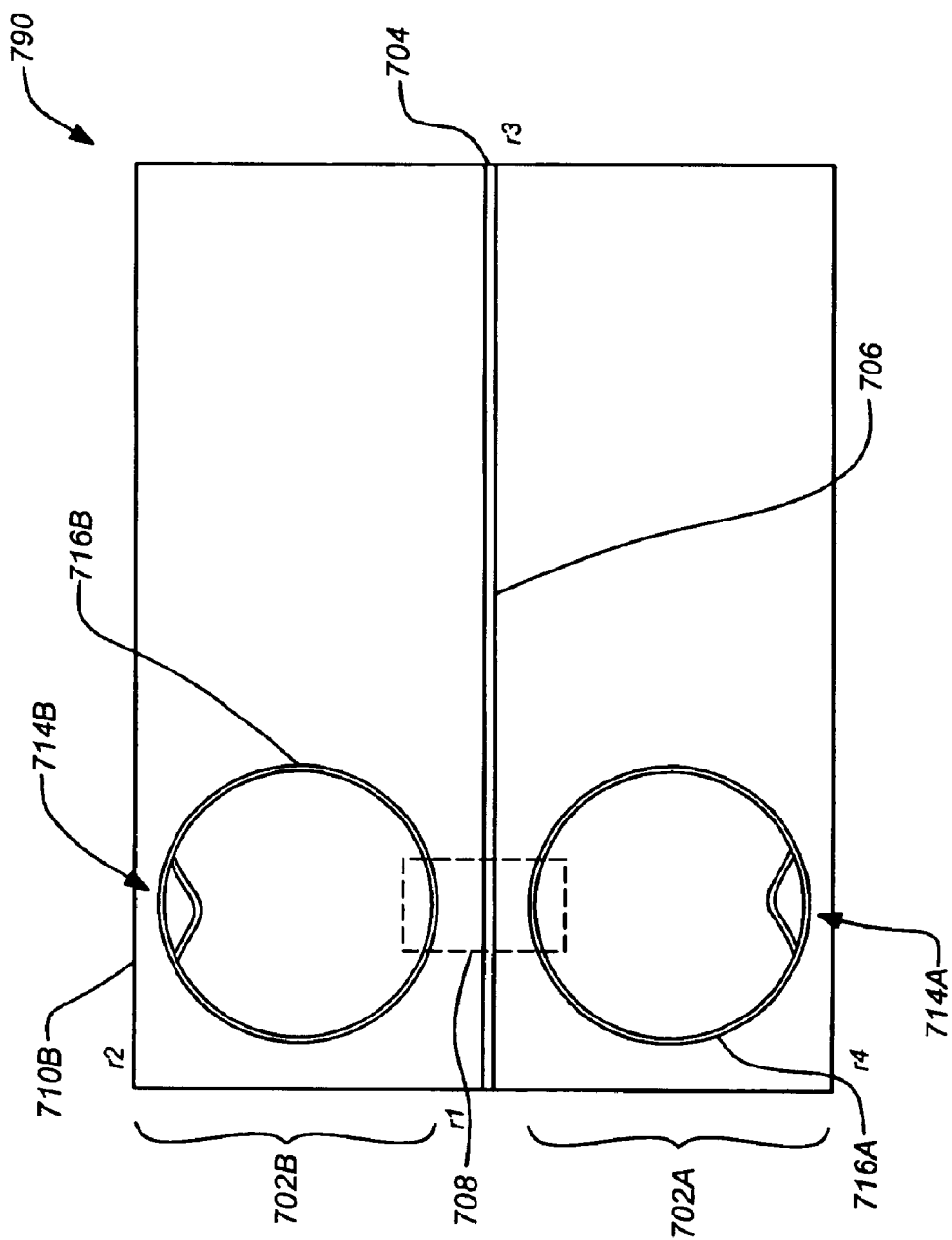

FIG. 7I illustrates a top view of a laser embodiment 790 where resonator 702A comprises a MZI 714A inside a ring resonator 716A and resonator 702B also comprises a MZI 714B inside a ring resonator 716B.

Figure 7J:
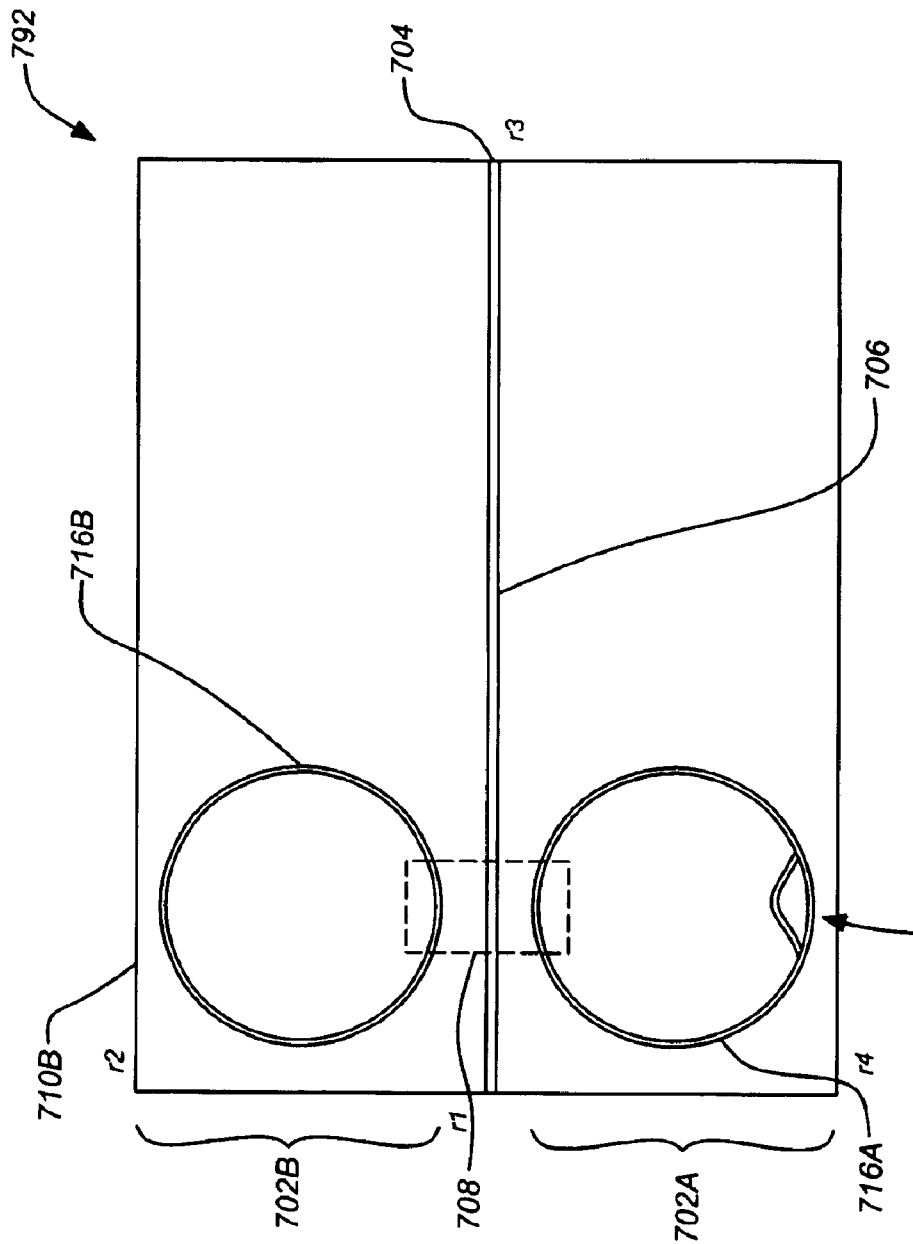

FIG. 7J illustrates a top view of a laser embodiment 792 where resonator 702A comprises a MZI inside a ring resonator 706A and resonator 702B comprises a ring resonator 716B.

5.3 Using Multiple Resonators With Resonators Both Sides of the Gain Medium

Figure 8A:
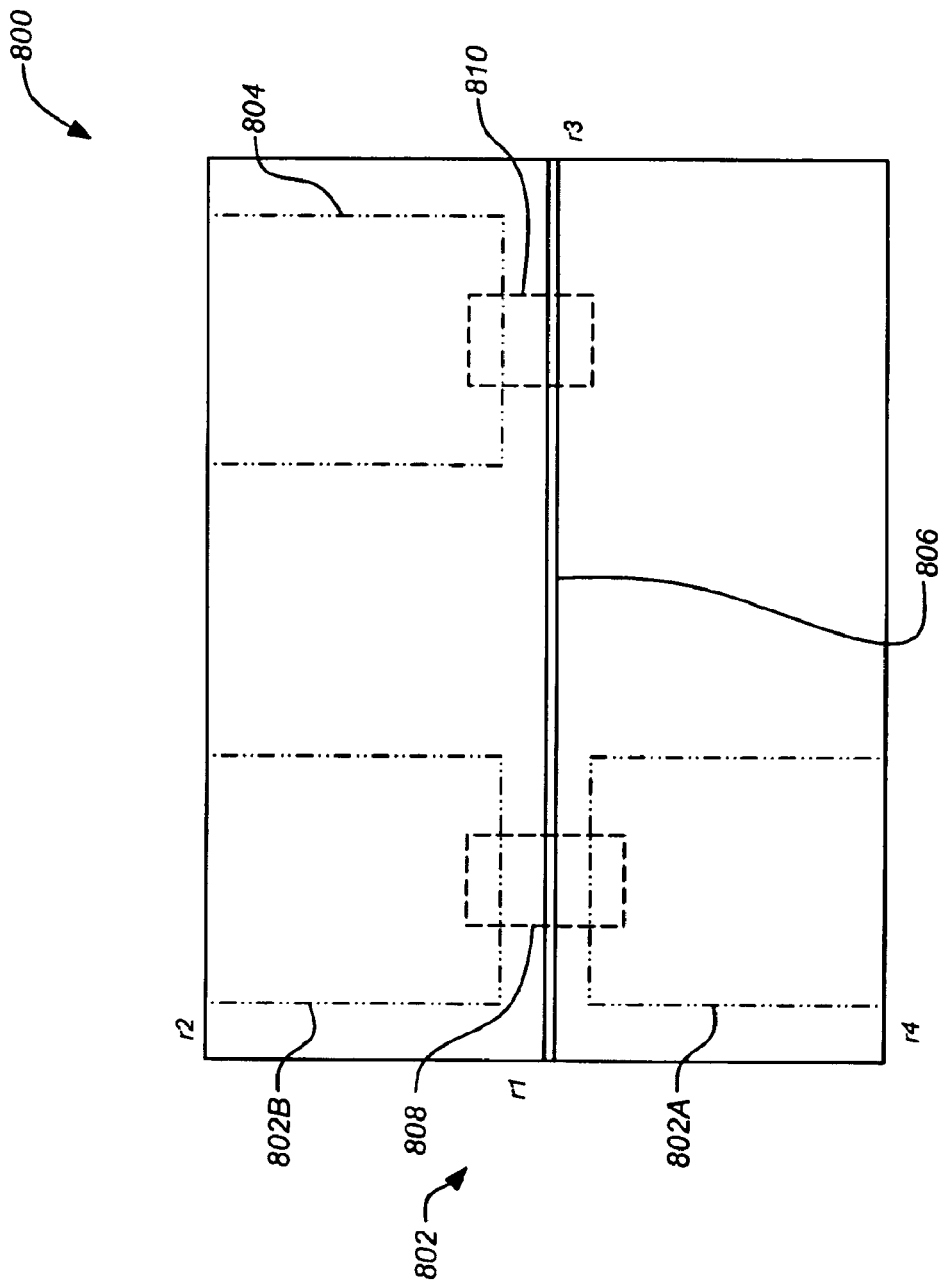
FIGS. 8A & 8B illustrate hybrid classes of the lasers of FIGS. 6A and 7A.
Figure 8B:
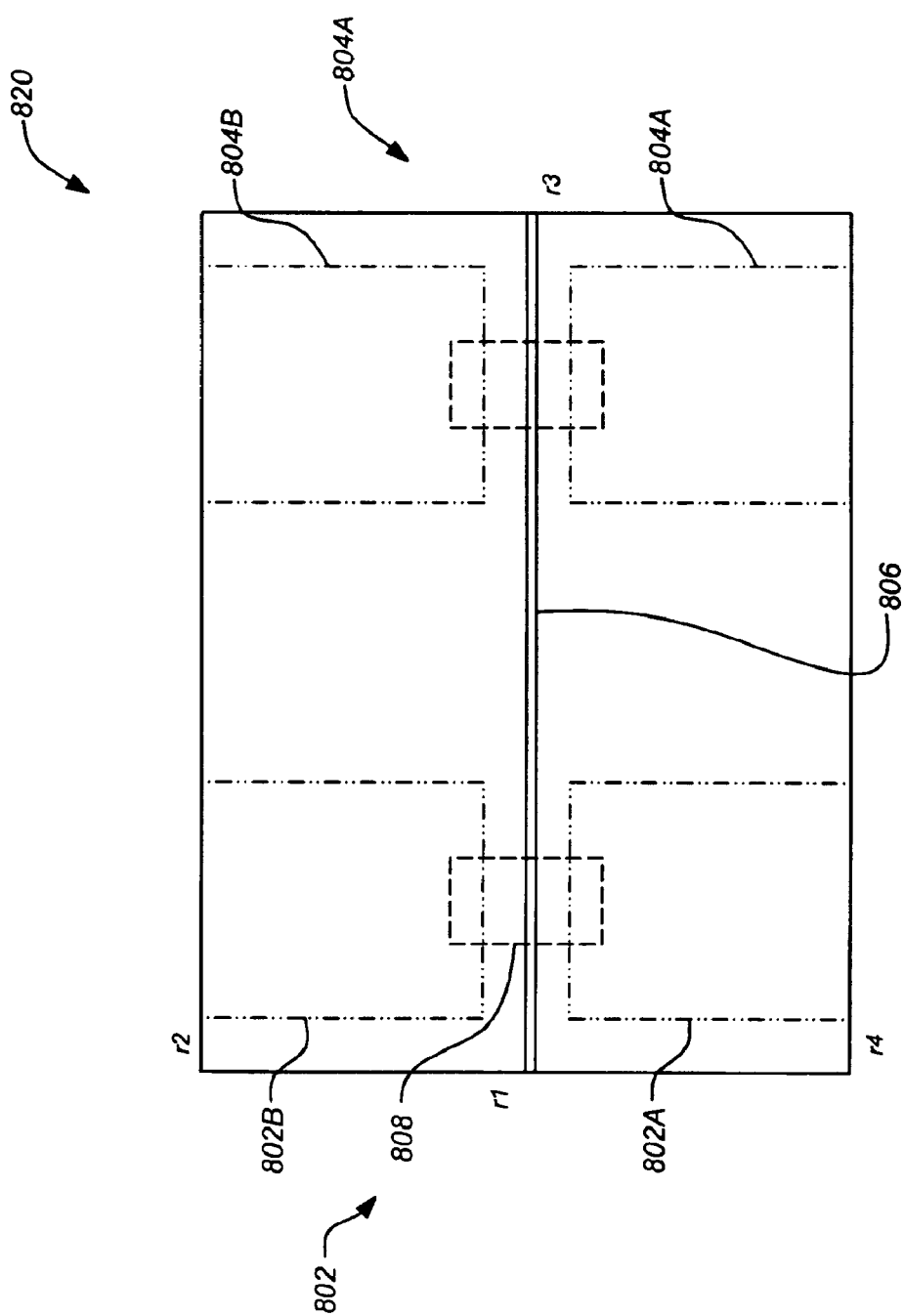

FIGS. 8A and 8B illustrate hybrid classes of the lasers of FIGS. 6A and 7A. The embodiments of FIGS. 8A and 8B operate using a Vernier technique, similar to the class of lasers defined by FIG. 6A. However, multiple resonators similar to the resonators of the class of lasers defined by FIG. 7A can be used on either side of a length of the gain medium 806.

FIG. 8A illustrates an alternate embodiment 800 where resonators 802, 804 are disposed on either side of a length of gain medium 806. In this case, paired resonators 802A, 802B are used on one side of the length of the gain medium 806 (on opposite sides of the width of the gain medium 806). A common coupling region 808 is used between the resonators 802A, 802B and the gain medium 806. The coupling region 808 can be designed similar to the 3 by 3 coupling region employed in the class of lasers described in FIG. 7A. A third single resonator 804 is used on the opposite side of the length of the gain medium 806. A single coupling region 810 is used between the single resonator 804 and the gain medium. The single resonator can be constructed as any of the single resonators of FIGS. 2A–2F, 6B and 6G. Similarly, the paired resonators 802A, 802B can be constructed as any of the pair resonators 702A, 702B of FIGS. 7B–7J.

FIG. 8B illustrates another alternate embodiment 820 where pairs of resonators 802 and 804 are disposed on either side of a length of gain medium 806. Paired resonators 802A, 802B are disposed on one side of the length of gain medium 806 and a second pair of resonators 804A, 804B are disposed on the opposite side of the length of gain medium 806 the paired resonators 802A, 802B and 804A, 804B can be constructed as any of the pair resonators 702A, 702B of FIGS. 7B–7J.

The foregoing description including the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. An optical device comprising: a medium including an edge forming a reflective facet; and
   a first waveguide within the medium, the waveguide having opposing ends formed by the reflective facet;
   wherein the optical device includes a coupling region to the first waveguide and the coupling region couples the waveguide to a gain medium of a second waveguide.

2. The optical device of claim 1, wherein the optical device is monolithically fabricated.

3. The optical device of claim 1, wherein the first waveguide includes a Mach-Zehnder interferometer.

4. The optical device of claim 1, wherein the first waveguide and the reflective facet operate as an optical resonator.

5. The optical device of claim 4, wherein the optical resonator comprises a tunable element of the optical device.

6. The optical device of claim 1, wherein the medium is formed into a Fabry-Perot cavity having opposing Fabry-Perot reflective facets adjacent to the reflective facet of the first waveguide.

7. The optical device of claim 1, wherein the medium is formed into a Fabry-Perot cavity having opposing Fabry-Perot reflective facets adjacent to the reflective facet of the first waveguide and the gain medium of the second waveguide having opposing ends formed by the Fabry-Perot reflective facets.

8. The optical device of claim 7, wherein the first waveguide includes a Mach-Zehnder interferometer.

9. An optical device comprising:
   a medium including an edge forming a reflective facet; and
   a waveguide within the medium, the waveguide having opposing ends formed by the reflective facet;
   wherein the waveguide includes a Mach-Zehnder interferometer.

10. The optical device of claim 9, wherein the optical device includes a coupling region to the waveguide.

11. An optical device comprising:
    a medium including an edge forming a reflective facet; and
    a waveguide within the medium, the waveguide having opposing ends formed by the reflective facet;
    wherein current injection is used to adjust the optical length of at least a portion of the waveguide.

12. The optical device of claim 11, wherein the medium is formed into a Fabry-Perot cavity having opposing Fabry-Perot reflective facets adjacent to the reflective facet of the waveguide.

13. The optical device of claim 11, wherein the optical device is monolithically fabricated.

14. The optical device of claim 11, wherein the waveguide includes a Mach-Zehnder interferometer.

15. The optical device of claim 11, wherein the optical device includes a coupling region to the waveguide and the coupling region couples the waveguide to a gain medium.

16. The optical device of claim 15, wherein coupling region couples the waveguide to a gain medium.

17. The optical device of claim 15, wherein the medium is formed into a Fabry-Perot cavity having opposing Fabry-Perot reflective facets adjacent to the reflective facet of the waveguide and a gain medium having opposing ends formed by the Fabry-Perot reflective facets.

18. The optical device of claim 17, wherein the waveguide comprises a Mach-Zehnder interferometer.

19. The optical device of claim 11, wherein die waveguide and the reflective facet operate as an optical resonator.

20. The optical device of claim 19, wherein the optical resonator comprises a tunable element of the optical device.

* * * * *